(12) United States Patent
Takehana et al.

(10) Patent No.: US 12,000,904 B2
(45) Date of Patent: Jun. 4, 2024

(54) ESTIMATION DEVICE, ESTIMATION METHOD, AND COMPUTER PROGRAM

(71) Applicant: GS Yuasa International Ltd., Kyoto (JP)

(72) Inventors: Ryosuke Takehana, Kyoto (JP); Nan Ukumori, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 155 days.

(21) Appl. No.: 17/754,230

(22) PCT Filed: Sep. 30, 2020

(86) PCT No.: PCT/JP2020/037145
§ 371 (c)(1),
(2) Date: Mar. 28, 2022

(87) PCT Pub. No.: WO2021/066008
PCT Pub. Date: Apr. 8, 2021

(65) Prior Publication Data
US 2022/0373608 A1 Nov. 24, 2022

(30) Foreign Application Priority Data

Sep. 30, 2019 (JP) .................................. 2019-180610
Sep. 30, 2019 (JP) .................................. 2019-180611

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/382* (2019.01);
(Continued)

(58) Field of Classification Search
None
See application file for complete search history.

(56) References Cited

U.S. PATENT DOCUMENTS

| 11,428,747 B2 | 8/2022 | Ukumori |
| 2012/0200266 A1 | 8/2012 | Berkowitz et al. |

(Continued)

FOREIGN PATENT DOCUMENTS

| JP | 2006-012761 A | 1/2006 |
| JP | 2015-060761 A | 3/2015 |

(Continued)

OTHER PUBLICATIONS

International Search Report and Written Opinion for International Application No. PCT/JP2020/037145, dated Dec. 15, 2020, (8 pages), Japan Patent Office, Tokyo, Japan, English Translation of International Search Report.

*Primary Examiner* — Jas A Sanghera
(74) *Attorney, Agent, or Firm* — Alston & Bird LLP

(57) ABSTRACT

An estimation device 4 is provided with: an acquisition unit 41 for acquiring time-series data about an SOC of a power storage element; a specification unit 41 for specifying a fluctuation range of the SOC in the time-series data and an SOC representative value representing an SOC region in the fluctuation range; and an estimation unit 41 for estimating a shape change of the power storage element on the basis of the specified fluctuation range and the specified representative value.

16 Claims, 33 Drawing Sheets

(51) Int. Cl.
    *G01R 31/382*     (2019.01)
    *H02J 7/00*     (2006.01)

(52) U.S. Cl.
    CPC ............ *H02J 7/0048* (2020.01); *H02J 7/005* (2020.01); *H02J 7/00712* (2020.01)

(56) References Cited

U.S. PATENT DOCUMENTS

2016/0195589 A1     7/2016    Hanyu et al.
2019/0198938 A1*   6/2019    Fujita .................... H02J 7/0029

FOREIGN PATENT DOCUMENTS

| | | |
|---|---|---|
| JP | 2016-093066 A | 5/2016 |
| JP | 2016-126943 A | 7/2016 |
| JP | 2018-085781 A | 5/2018 |
| JP | 2018-169393 A | 11/2018 |
| JP | 2019-040845 A | 3/2019 |
| JP | 2019-091565 A | 6/2019 |
| JP | 2020-145063 A | 9/2020 |
| WO | WO-2019/044067 A1 | 3/2019 |

* cited by examiner

|  |  | ΔSOC(%) | | | | | | | | |
|---|---|---|---|---|---|---|---|---|---|---|
|  |  | 10 | 15 | 20 | 25 | 30 | 35 | 40 | 45 | 50 |
| Center SOC (%) | 10 | k1a | k1b | k1c | k1d | k1e | k1f | k1g | k1h | k1i |
| | 15 | k2a | ... | ... | ... | ... | ... | ... | ... | k2i |
| | 20 | k3a | ... | ... | ... | ... | ... | ... | ... | k3i |
| | 25 | k4a | ... | ... | ... | ... | ... | ... | ... | k4i |
| | 30 | k5a | ... | ... | ... | ... | ... | ... | ... | k5i |
| | 35 | k6a | ... | ... | ... | ... | ... | ... | ... | k6i |
| | 40 | k7a | ... | ... | k7d | ... | ... | ... | ... | k7i |
| | 45 | k8a | ... | ... | ... | ... | ... | ... | ... | k8i |
| | 50 | k9a | ... | ... | ... | ... | ... | ... | ... | k9i |

ESTIMATION DEVICE, ESTIMATION METHOD, AND COMPUTER PROGRAM

CROSS REFERENCE TO RELATED APPLICATIONS

This application is a national stage application, filed under 35 U.S.C. § 371, of International Application No. PCT/JP2020/037145, filed Sep. 30, 2020, which claims priority to and the benefit of both: Japan Application No. 2019-180610, filed Sep. 30, 2019, and Japan Application No. 2019-180611, filed Sep. 30, 2019; the contents of all of which as are hereby incorporated by reference in their entireties.

BACKGROUND

Technical Field

The present invention relates to an estimation device, an estimation method, and a computer program for estimating a shape change of an energy storage device or deterioration of the energy storage device.

Description of Related Art

An energy storage device capable of storing electric energy and supplying energy as a power source when necessary is used. The energy storage device is applied to portable equipment, a power supply device, transportation equipment including automobiles and railways, industrial equipment including aerospace and construction, and the like.

An energy storage device (hereinafter, also referred to as a battery) such as a lithium ion secondary battery is gradually deteriorated by repeated charge and discharge. One of phenomena associated with this deterioration is an increase in thickness of a case accommodating an element due to an increase in internal pressure due to generation of gas inside the battery, expansion of the electrode assembly, or the like.

A battery module is often formed by connecting a plurality of batteries in series, and is mounted on a device. It is important to design an optimum battery module in consideration of the thickness increase amount of the case from the viewpoint of cost and battery performance, and it is also important in designing a device on which the battery module is mounted. It is necessary to accurately predict the shape change of the battery in order to design the battery module so as to maximize the performance of the battery and to apply the model-based development to the device on which the battery module is mounted.

Patent Document JP-A-2016-93066 discloses a control device for a secondary battery that stores a state of a secondary battery as a history, acquires a coefficient correlated with a gas generation amount in a battery case based on the stored history, and calculates a deterioration amount of the secondary battery from the acquired coefficient and the history.

It is important to easily and accurately estimate a state of health (SOH: capacity retention ratio, resistance value, etc.) of a battery in determining availability and a use method of the battery.

Many techniques for estimating an SOH of a battery have been developed. Based on past use history data, a method with high accuracy but requiring a long time for estimation and high cost, a simple method with low estimation accuracy, and the like are used.

In the deterioration diagnosis method of Patent Document JP-A-2015-60761, a thickness W at the time of charging and discharging the secondary battery is measured, a thickness characteristic represented as a relationship between a thickness W and a voltage V (or a charge amount Q) is acquired, and a voltage $V_W$ (or $Q_W$) that is a voltage (or a charge amount) at which the thickness W starts to increase is calculated as a feature amount. The feature amount is compared with the deterioration characteristic of the voltage $V_W$ (or $Q_W$) to diagnose the capacity deterioration of the secondary battery.

BRIEF SUMMARY

In the conventional method such as Patent Document JP-A-2016-93066, the accuracy of estimating the thickness increase amount of the battery is insufficient. It is desired to improve estimation accuracy including a case where a fluctuation pattern of a state of charge (SOC) is complicated.

In the deterioration diagnosis method of Patent Document JP-A-2015-60761, the use of the battery is stopped to obtain the thickness W of the battery, and the deterioration cannot be estimated at all times during the use of the battery. It is desired to improve the estimation accuracy of the deterioration including a case where the fluctuation pattern of the SOC is complicated.

One aspect of the present invention provides an estimation device, an estimation method, and a computer program for estimating a shape change of an energy storage device.

Another aspect of the present invention provides an estimation device, an estimation method, and a computer program for estimating deterioration of an energy storage device.

An estimation device according to one aspect of the present invention includes: an acquisition unit that acquires time-series data of an SOC in an energy storage device; a determination unit that determines a fluctuation range of the SOC in the time-series data and an SOC representative value representing an SOC region in the fluctuation range; and an estimation unit that estimates a shape change of the energy storage device based on the determined fluctuation range and the determined SOC representative value.

An estimation method according to one aspect of the present invention includes: acquiring time-series data of an SOC in an energy storage device; determining a fluctuation range of the SOC in the time-series data and a representative value of the SOC representing an SOC region in the fluctuation range; and estimating a shape change of the energy storage device based on the determined fluctuation range and the determined representative value.

A computer program according to one aspect of the present invention causes a computer to execute processing of: acquiring time-series data of an SOC in an energy storage device; determining a fluctuation range of the SOC in the time-series data and a representative value of the SOC representing an SOC region in the fluctuation range; and estimating a shape change of the energy storage device based on the determined fluctuation range and the determined representative value.

An estimation device according to another aspect of the present invention includes: a first acquisition unit that acquires time-series data of an SOC in an energy storage device; a second acquisition unit that acquires a shape change of the energy storage device; a determination unit that determines a representative value of the SOC in a predetermined period of the time-series data and an SOC fluctuation amount; and an estimation unit that estimates deterioration of the energy storage device based on the determined representative value, the determined SOC fluctuation amount, and the acquired shape change.

An estimation method according to another aspect of the present invention includes: acquiring time-series data of an SOC in an energy storage device; acquiring a shape change of the energy storage device; determining a representative value of the SOC in a predetermined period of the time-series data and an SOC fluctuation amount; and estimating deterioration of the energy storage device based on the determined representative value, the determined SOC fluctuation amount, and the acquired shape change.

A computer program according to another aspect of the present invention causes a computer to execute processing of: acquiring time-series data of an SOC in an energy storage device; acquiring a shape change of the energy storage device; determining a representative value of the SOC in a predetermined period of the time-series data and an SOC fluctuation amount; and estimating deterioration of the energy storage device based on the determined representative value, the determined SOC fluctuation amount, and the acquired shape change.

In one aspect of the present invention, it is possible to accurately estimate the deterioration of the energy storage device. In another aspect of the present invention, it is possible to accurately estimate the deterioration of the energy storage device.

DETAILED DESCRIPTION OF VARIOUS EMBODIMENTS

Outline of One Aspect

Figure 1:
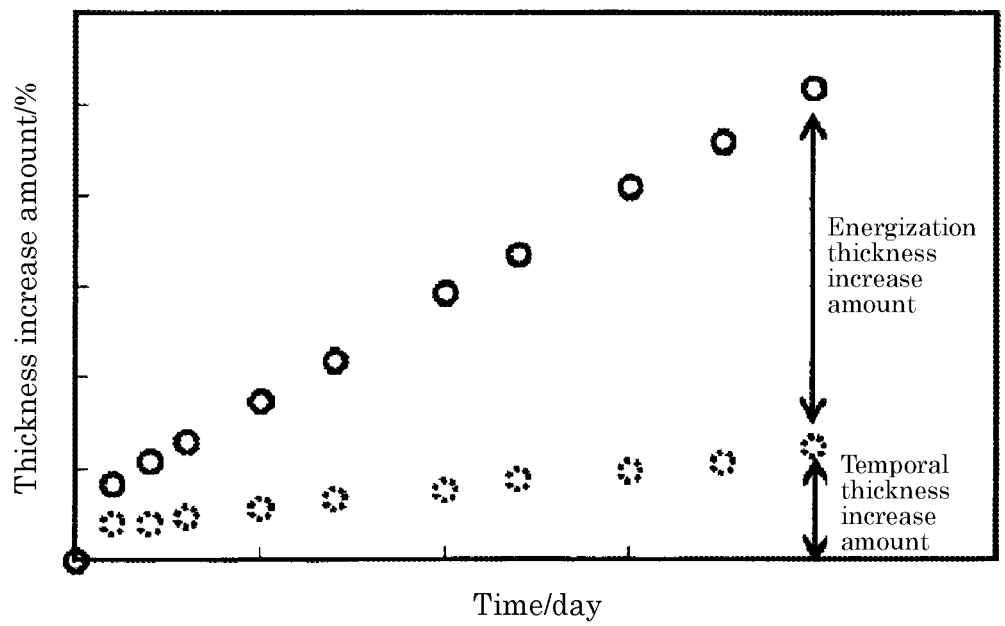
FIG. 1 is a graph showing a temporal change in a thickness increase amount.

An estimation device includes: an acquisition unit that acquires time-series data of an SOC in an energy storage device; a determination unit that determines a fluctuation range of the SOC in the time-series data and an SOC representative value representing an SOC region in the fluctuation range; and an estimation unit that estimates a shape change of the energy storage device based on the determined fluctuation range and the determined SOC representative value.

The present inventors have found that even when the fluctuation range of the SOC is the same, if the SOC representative value representing the SOC region in the fluctuation range, for example, the SOC at the center is different, the thickness increase amount of the energy storage device is greatly different. The present inventors have found that even when the SOC representative value is the same, if the fluctuation range of the SOC is different, the thickness increase amount of the energy storage device is greatly different. Further, the present inventors have found that even if the fluctuation value and the representative value of the SOC are the same, when the temperature of the energy storage device is different, the thickness increase amount of the energy storage device is different. The present inventors have found that, when estimating the shape change of the energy storage device, it is necessary to consider path information (SOC use range) of an SOC in which the energy storage device is used and a temperature representative value in a period of the path. Examples of the SOC representative value include an average SOC, a mode, a minimum value, and a maximum value in addition to the center value of the SOC in the period of the path. Examples of the temperature representative value include an average value, a mode value, a median value, and the like of the section of the fluctuation range.

When the temperature representative value of the energy storage device is estimated to be constant from the load pattern (use pattern) or the like of the energy storage device, the temperature can be set as the temperature representative value.

Here, the shape change refers to a displacement amount such as swelling of an electrode assembly or an element, a displacement amount of a case (which may be either a sealed type or an open type.) accommodating the electrode assembly or the element, a change in outward spreading force (reaction force), a change in pressure applied to at least one surface of the energy storage device, or a combination thereof.

Examples of the housing case include a prismatic case, a cylindrical case, and a pouch laminate film.

The shape change can be estimated in any of the state where the energy storage device is completely restrained, the free state, and the intermediate state.

According to the above configuration, since the shape change of the energy storage device is estimated based on the determined fluctuation range and the determined SOC representative value, that is, the shape change is estimated in consideration of the SOC use range, the estimation accuracy is good including the case where the fluctuation pattern of the SOC is complicated.

Since the shape change of the battery can be accurately estimated, an appropriate battery module can be designed.

Examples of the method of determining the SOC representative value and the like include the following four examples. Indexes (setting of section for estimating shape change, threshold, and the like) are different for increasing determination accuracy, and a determining method can be selectively used according to the indexes.

In the estimation device described above, as a first determining method, the determination unit may acquire a charge start point and a discharge start point based on the time-series data; and determine the fluctuation range and the SOC representative value based on the acquired charge start point and the acquired discharge start point.

In the first determining method, it is not necessary to set the section and the threshold.

According to the above configuration, the fluctuation range and the representative value of the SOC can be easily determined at the timing when the charge is started and the discharge is started. Even when charge and discharge are irregular and the SOC fluctuates complicatedly, the fluctuation range and the representative value can be determined satisfactorily.

In the estimation device described above, as a second determining method, the determination unit may calculate, based on the time-series data, a fluctuation range and an SOC representative value each time an SOC reach a threshold from a start point; and determine a fluctuation range and an SOC representative value calculated from the start point to a calculation time point.

In the second determining method, it is necessary to set the threshold.

According to the above configuration, every time the SOC reaches the threshold from the start point, the fluctuation range of the SOC can be easily determined by summing up, and the SOC representative value in the determined fluctuation range is determined. Even when charge and discharge are irregular and the SOC fluctuates complicatedly, the fluctuation range and the SOC representative value can be determined satisfactorily.

In the estimation device described above, as a third determining method, the determination unit may calculate a standard deviation and an average value of an SOC based on the time-series data, and determine the calculated standard deviation and average value as the fluctuation range and the SOC representative value.

In the third determining method, it is necessary to set a section.

According to the above configuration, the fluctuation range and the representative value can be easily determined by statistical processing. Even when charge and discharge are irregular and the SOC fluctuates complicatedly, the fluctuation range and the SOC representative value can be determined satisfactorily.

In the estimation device described above, as a fourth determining method, the determination unit may convert a waveform of fluctuation of the SOC in the time-series data into a frequency component, and determine an amplitude of the converted frequency component as the fluctuation range, and a frequency as a fluctuation amount of the SOC.

In the fourth determining method, it is necessary to set a section. Here, the fluctuation amount of the SOC is an integrated SOC fluctuation amount and corresponds to the number of cycles.

According to the above configuration, since the waveform of the fluctuation of the SOC is converted into the frequency component, a waveform having a large fluctuation but a long period (fluctuation time) and a waveform having a small fluctuation but a short period can also be detected. The waveform having a large fluctuation but a long period is a waveform component having a large intensity (spectral intensity, amplitude spectrum in case of Fourier transform) and a low frequency. The waveform having a small fluctuation but a short period is a waveform component having a small intensity and a high frequency. When the cycle is very long even if the fluctuation is large, the shape change of the energy storage device is small. When the cycle is very short even if the fluctuation is small, the shape change is large. Although the waveform of the fluctuation of the SOC varies depending on the characteristics of the energy storage device and the way of use by the user, according to the above configuration, any waveform can be detected to satisfactorily estimate the shape change of the energy storage device.

The estimation unit may determine an expansion coefficient based on the determined fluctuation range and the determined SOC representative value with reference to a relationship between a fluctuation range, an SOC representative value, and an expansion coefficient, and estimate the shape change based on the determined expansion coefficient and a fluctuation amount of an SOC or time.

According to the above configuration, the expansion coefficient is determined based on the determined fluctuation range and the determined SOC representative value with reference to the relationship between the fluctuation range, the SOC representative value, and the expansion coefficient obtained in advance by experiment or the like, and the shape change is estimated, and thus the estimation accuracy is good.

The estimation unit may calculate a shape change of the energy storage device at the time of energization based on the fluctuation range and the SOC representative value, and estimate a shape change by adding a temporal shape change of the energy storage device to the calculated shape change.

According to the above configuration, it is possible to accurately estimate the shape change of the energy storage device in consideration of the temporal shape change at the time of non-energization. As an example, the temporal shape change is added to the shape change at the time of energization. Further, only the shape change at the time of energization may be estimated at the time of energization, and only the temporal shape change may be estimated at the time of pause.

The estimation device described above may further include a prediction unit that predicts a remaining life of the energy storage device based on a shape change estimated by the estimation unit.

According to the above configuration, in the graph of the shape change, the remaining life can be predicted with the time when the shape change exceeds the threshold as the life.

The shape change may include information on pressure applied to at least one surface of the energy storage device.

According to the above configuration, the shape change of the energy storage device can be estimated by the change in pressure. For example, the battery module can be favorably designed by estimating the pressing force of the end plate sandwiching the plurality of energy storage devices connected in series. When the energy storage device is not restrained, a change in reaction force and a change in pressure applied to one surface can be defined as a shape change.

The acquisition unit may acquire a temperature of the energy storage device in a section corresponding to the SOC region, the determination unit may determine a temperature representative value representing the temperature of the section, and the estimation unit may estimate the shape change based on the temperature representative value.

As described above, even if the fluctuation value of the SOC and the SOC representative value are the same, when the temperature of the energy storage device is different, the thickness increase amount of the energy storage device is different.

According to the above configuration, it is possible to satisfactorily estimate the shape change of the energy storage device in consideration of the temperature representative value of the energy storage device.

An estimation method includes: acquiring time-series data of an SOC in an energy storage device; determining a fluctuation range of the SOC in the time-series data and a representative value of the SOC representing an SOC region in the fluctuation range; and estimating a shape change of the energy storage device based on the determined fluctuation range and the determined representative value.

According to the above configuration, since the estimation is performed in consideration of the SOC use range of the energy storage device, the estimation accuracy is good including the case where the fluctuation pattern of the SOC is complicated.

A computer program causes a computer to execute processing of: acquiring time-series data of an SOC in an energy storage device; determining a fluctuation range of the SOC in the time-series data and a representative value of the SOC representing an SOC region in the fluctuation range; and estimating a shape change of the energy storage device based on the determined fluctuation range and the determined representative value.

According to the above configuration, since the estimation is performed in consideration of the use range of the SOC of the energy storage device, the estimation accuracy is good including the case where the fluctuation pattern of the SOC is complicated.

A computer program causes a computer to execute processing of: estimating time-series data of an SOC in an energy storage device; determining a fluctuation range of the SOC in the estimated time-series data and a representative value of the SOC representing an SOC region in the fluctuation range; and estimating a shape change of the energy storage device based on the determined fluctuation range and the determined representative value.

According to the above configuration, by determining the fluctuation range of the SOC and the SOC representative value based on the time-series data assuming the method of using the energy storage device, the shape change of the energy storage device when the predetermined period elapses can be predicted.

The computer program described above may cause a computer to execute processing of designing the energy storage device based on the estimated shape change.

According to the above configuration, the shape change of the energy storage device when the predetermined period elapses is predicted, and the shape of a spacer arranged between the plurality of energy storage devices, the arrangement interval, the pressing force of the end plate sandwiching the plurality of energy storage devices, and the like can be favorably designed. Therefore, the performance of the energy storage device can be maximized, the excessive increase in size of the battery module can be avoided, and the cost can be reduced.

As described above, an algorithm in which a C rate (charge-discharge rate, relative ratio of a charge-discharge current value (A) to a battery capacity (Ah) at the time of charging/discharging the battery, for example, the discharge rate 1C refers to a current value at which a battery having a certain capacity is discharged at a constant current and the discharge ends in one hour) is further considered may be combined to the estimation technique described in the outline of one aspect. Estimation is performed in consideration of another dynamic parameter called a C rate, so that estimation accuracy can be improved.

Outline of Other Aspect

An estimation device includes: a first acquisition unit that acquires time-series data of an SOC in an energy storage device; a second acquisition unit that acquires a shape change of the energy storage device; a determination unit that determines a representative value of an SOC in a predetermined period of the time-series data and an SOC fluctuation amount; and an estimation unit that estimates deterioration of the energy storage device based on the determined representative value, the determined SOC fluctuation amount, and the acquired shape change.

Here, the representative value of the SOC refers to an average value, a center value, a mode value, a minimum value, a maximum value, or the like of the SOC in a predetermined period of the time-series data. The deterioration of the energy storage device can be estimated by acquiring the shape change in any of the state where the energy storage device is completely restrained, the free state, and the intermediate state.

The SOC fluctuation amount refers to an integrated value (total SOC) of the fluctuation amount of the SOC, and corresponds to the number of cycles.

The shape change of the energy storage device has a strong correlation with the capacity change of the energy storage device. The present inventors have found that the change amount of the SOH with respect to the thickness increase amount varies depending on the representative SOC when the use of the energy storage device is stopped. The present inventors have found that when the fluctuation amount of the SOC is the same during use of the energy storage device, the change amount of the SOH varies depending on the representative SOC. The present inventors have found that when the representative SOC is the same, the change amount of the SOH varies depending on the SOC fluctuation amount. The present inventors have found that it is necessary to consider the representative value of the SOC and the SOC fluctuation amount, which are feature values of the time-series data of the SOC, when estimating the deterioration of the energy storage device.

According to the above configuration, the deterioration of the energy storage device is estimated based on the representative value and the SOC fluctuation amount, which are feature values of the time-series data of the SOC, and the acquired shape change of the energy storage device. It is possible to easily and accurately estimate the deterioration at an arbitrary time point during the use of the energy storage device including the case where the fluctuation pattern of the SOC is complicated.

The information necessary for the estimation is the feature value and the shape change of the energy storage device, and it is not necessary to use a large measuring device such as a charge-discharge device, and the labor and cost can be suppressed. When the load pattern of the energy storage device is substantially determined in advance, the center SOC, the SOC fluctuation amount, and the average temperature assumed in advance are known, so that the SOH can be estimated only by the information on the shape change during the operation. The SOH can be estimated from the information on the center SOC, the SOC fluctuation amount, and the average temperature, and the information on the shape change in the load pattern having the highest use frequency.

Since the deterioration can be estimated by a shape change of the energy storage device, the deterioration of the energy storage device can be constantly monitored only by installing a sensor that detects a thickness, an internal pressure, or the like, calculation of estimation can be simplified, and a battery management unit (BMU) can be simplified.

The estimation unit may determine a coefficient based on the determined representative value and the determined SOC fluctuation amount with reference to a relationship between a representative value, an SOC fluctuation amount, and a coefficient, and estimate the deterioration based on the determined coefficient and the acquired shape change.

According to the above configuration, the deterioration is estimated by determining the coefficient based on the determined representative value with reference to the relationship between the representative value, the SOC fluctuation amount, and the coefficient, so that the estimation accuracy is good.

The estimation device described above may further include a third acquisition unit that acquires a temperature of the energy storage device in the SOC region, the determination unit may determine a temperature representative value based on the acquired temperature, and the estimation unit may estimate the deterioration based on the determined temperature representative value.

Examples of the temperature representative value include an average value, a mode value, a median value, and the like of the section of the fluctuation range.

When the representative SOC and the SOC fluctuation amount are the same, the change amount of the SOH varies depending on the temperature.

According to the above configuration, when the temperature representative value such as the average temperature of the energy storage device is not constant, the average temperature can be determined based on the acquired temperature, and the deterioration of the energy storage device can be accurately estimated based on the average temperature.

An estimation method includes: acquiring time-series data of an SOC in an energy storage device; acquiring a shape change of the energy storage device; determining a representative value of an SOC in a predetermined period of the time-series data and an SOC fluctuation amount; and estimating deterioration of the energy storage device based on the determined representative value, the determined SOC fluctuation amount, and the acquired shape change.

According to the above configuration, the deterioration of the energy storage device is estimated based on the representative value and the SOC fluctuation amount, which are feature values of the time-series data of the SOC, and the acquired shape change of the energy storage device. It is possible to easily and accurately estimate the deterioration at an arbitrary time point during the use of the energy storage device including the case where the fluctuation pattern of the SOC is complicated.

A computer program causes a computer to execute processing of: acquiring time-series data of an SOC in an energy storage device; acquiring a shape change of the energy storage device; determining a representative value of an SOC in a predetermined period of the time-series data and an SOC fluctuation amount; and estimating deterioration of the energy storage device based on the determined representative value, the determined SOC fluctuation amount, and the acquired shape change.

According to the above configuration, the deterioration of the energy storage device is estimated based on the representative value and the SOC fluctuation amount, which are feature values of the time-series data of the SOC, and the acquired shape change of the energy storage device. It is possible to easily and accurately estimate the deterioration at an arbitrary time point during the use of the energy storage device including the case where the fluctuation pattern of the SOC is complicated.

As described above, an algorithm in which a C rate is further considered may be combined with the estimation technique described in in the outline of another aspect. Estimation is performed in consideration of another dynamic parameter called a C rate, so that estimation accuracy can be improved.

Embodiment According to One Aspect of the Present Invention

Hereinafter, a method of estimating a shape change of an energy storage device will be specifically described.

FIG. 1 is a graph showing a temporal change in a thickness increase amount. The horizontal axis represents time (day), and the vertical axis represents a thickness increase amount (%). The thickness increase amount is calculated by a sum of a thickness increase amount due to energization and a temporal thickness increase amount at the time of non-energization. The temporal thickness increase amount is represented by a function of time with a predetermined coefficient as a factor, and the thickness increase amount due to energization is represented by a function of time with a predetermined coefficient as a factor or a total SOC (total fluctuation amount of SOC).

Figure 2:
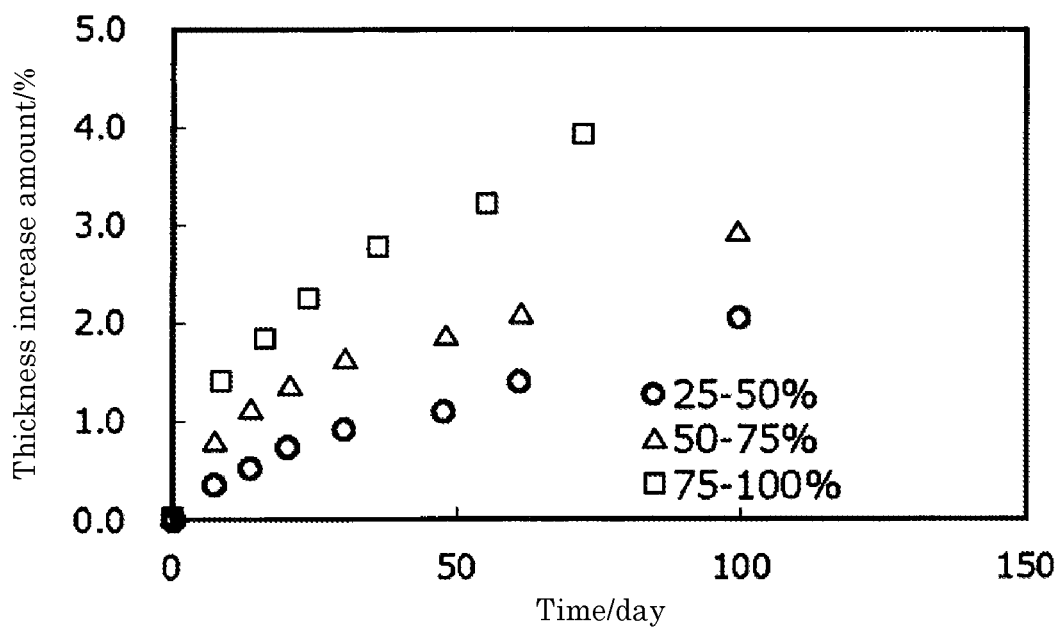
FIG. 2 is a graph showing a relationship between time and a thickness increase amount when ΔSOC is 25%, a charge-discharge current is the same, and a center SOC is changed to 37.5%, 62.5%, or 87.5%.

FIG. 2 is a graph showing a relationship between time and a thickness increase amount when ΔSOC (SOC fluctuation range) is 25%, a charge-discharge current is the same, and a center SOC is changed to 37.5% (○), 62.5% (Δ), or 87.5% (□). The horizontal axis represents time (day), and the vertical axis represents a thickness increase amount (%). The thickness increase amount is the sum of the thickness increase amount due to energization and the temporal thickness increase amount at the time of non-energization.

Figure 3:
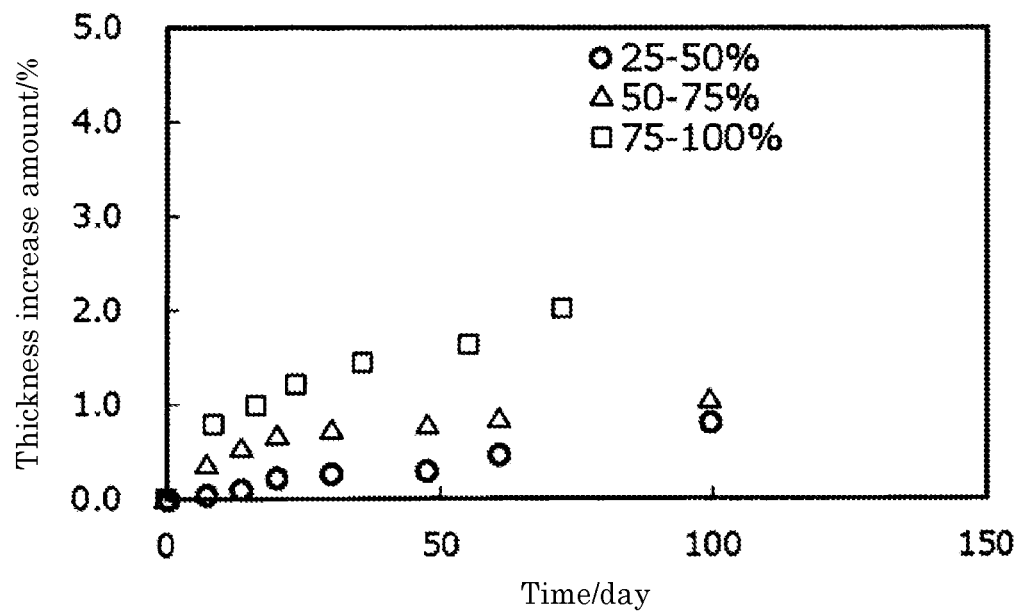
FIG. 3 is a graph showing a relationship between time and a thickness increase amount when a temporal thickness increase amount is subtracted from the total thickness increase amount in FIG. 2.

FIG. 3 is a graph showing the relationship between time and the thickness increase amount when the temporal thickness increase amount is subtracted from the total thickness increase amount in FIG. 2. The horizontal axis represents time (day), and the vertical axis represents a thickness increase amount (%).

From FIGS. 2 and 3, when the center SOC is different even if the ΔSOC is the same, the thickness increase amount due to energization changes. The thickness increase amount due to energization increases according to the size of the center SOC.

Figure 4:
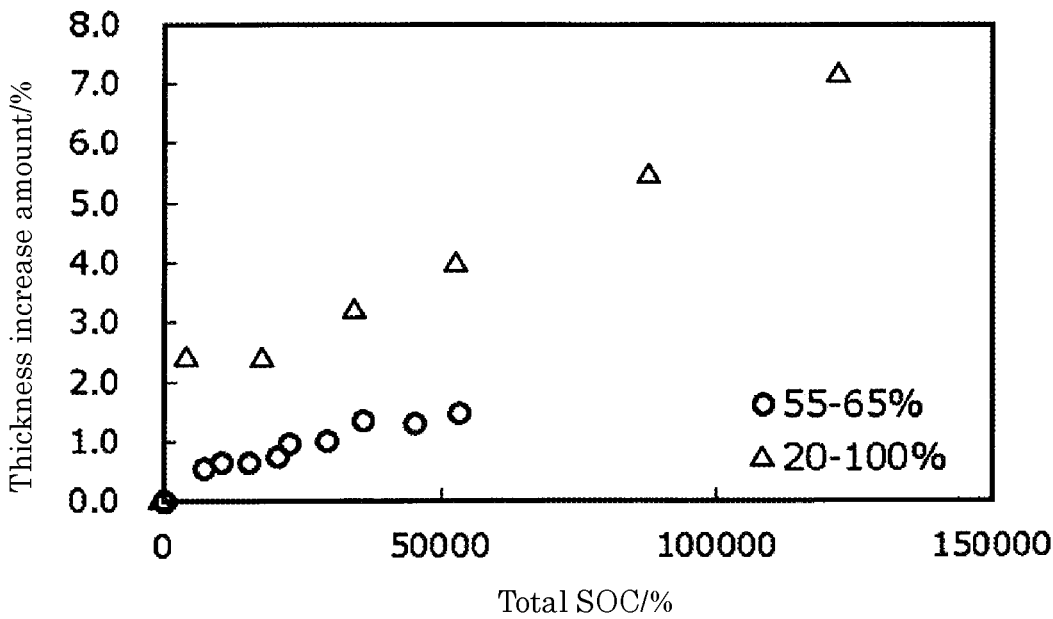
FIG. 4 is a graph showing a relationship between a total SOC and a thickness increase amount when a center SOC is 60%, a charge-discharge current is the same, and ΔSOC is changed to 10% and 80%.

FIG. 4 is a graph showing the relationship between the total SOC and the thickness increase amount when the center SOC is 60%, the charge-discharge current is the same, and the ΔSOC is changed to 10% (○) and 80% (Δ). The horizontal axis represents the total SOC (%), and the vertical axis represents the thickness increase amount (%). The thickness increase amount is the sum of the thickness increase amount due to energization and the temporal thickness increase amount at the time of non-energization.

Figure 5:
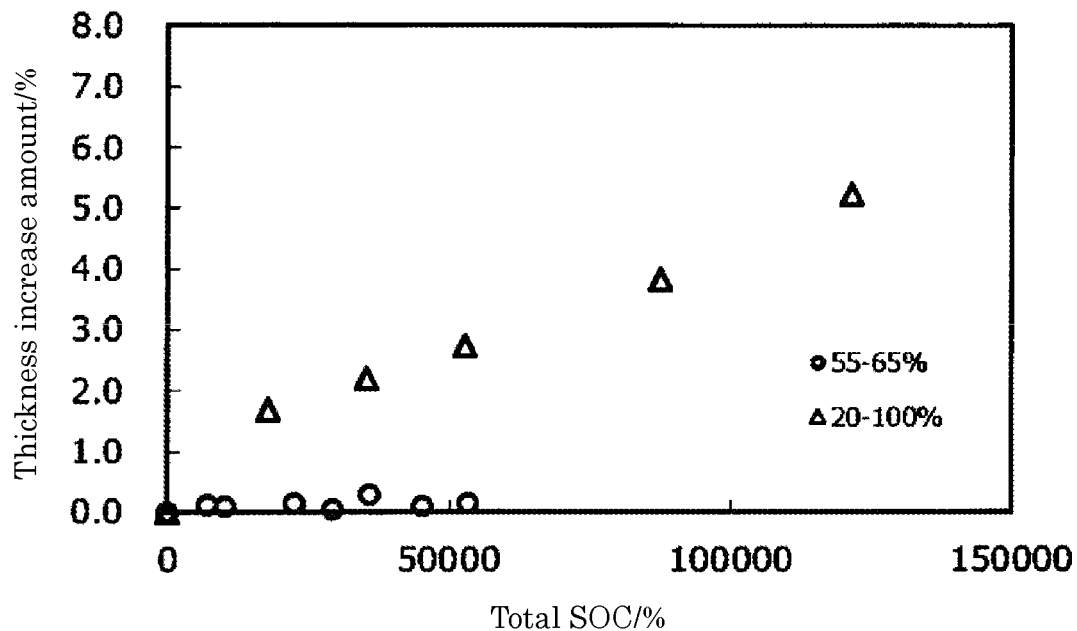
FIG. 5 is a graph showing a relationship between a total SOC and a thickness increase amount when a temporal thickness increase amount is subtracted from the total thickness increase amount in FIG. 4.

FIG. 5 is a graph showing the relationship between time and the thickness increase amount when the temporal thickness increase amount is subtracted from the total thickness increase amount of FIG. 4. The horizontal axis represents the total SOC (%), and the vertical axis represents the thickness increase amount (%).

As can be seen from FIGS. 4 and 5, when the fluctuation range (ΔSOC) of the SOC is different even if the center SOC is the same, the thickness increase amount due to energization changes. The thickness increase amount due to energization increases according to a fluctuation magnitude of the ΔSOC.

Figure 6:
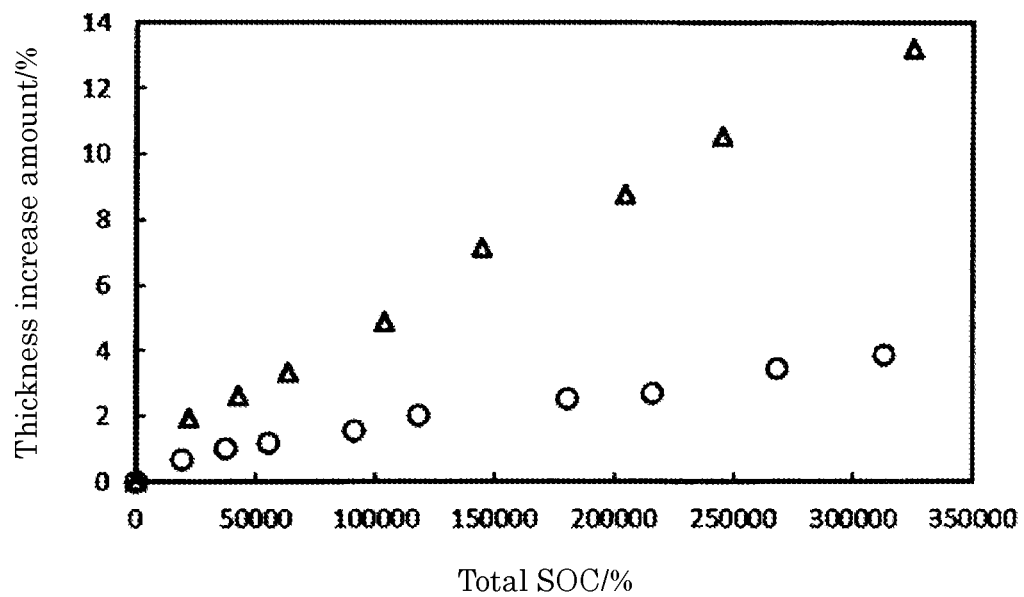
FIG. 6 is a graph showing a relationship between a total SOC and a thickness increase amount when a center SOC and ΔSOC are the same and the temperature is 25° C. and 45° C.

FIG. 6 is a graph showing the relationship between the total SOC and the thickness increase amount when the center SOC and the ΔSOC are the same and the temperature of the energy storage device is 25° C. (○) and 45° C. (Δ). The horizontal axis represents the total SOC (%), and the vertical axis represents the thickness increase amount (%). The thickness increase amount indicates a thickness increase amount due to energization obtained by subtracting the temporal thickness increase amount from the total thickness increase amount.

As can be seen from FIG. 6, when the center SOC and the ΔSOC are the same but the temperature is different, the thickness increase amount due to energization changes. The thickness increase amount due to energization increases as the temperature increases.

From the above, it can be seen that the thickness increase amount needs to be estimated in consideration of not only the total SOC or time but also the ΔSOC, the center SOC, and the temperature. It has been confirmed by experiments that there is a difference in the rate of the thickness increase depending on the energizing current when the cycle test is performed in the same fluctuation range of the SOC while the charge-discharge current is changed. That is, depending on the energizing current, it is necessary to correct a coefficient for obtaining the thickness increase amount.

The inventors of the present application have developed an estimation device that estimates the shape change of the energy storage device based on the ΔSOC, the representative SOC of the SOC region in the fluctuation range, and the temperature representative value. Examples of the shape change of the energy storage device include a thickness increase amount, a pressure applied to at least one surface of the energy storage device, and the like. The thickness increase amount refers to an increase amount in thickness of a central portion of a long side surface of the energy storage device or an increase amount in thickness on both sides. Examples of the representative SOC include a center SOC, an average SOC, a minimum SOC, and a maximum SOC of the SOC region. Hereinafter, the thickness increase amount will be described as the thickness of the central portion of the long side surface of the energy storage device.

The estimation method according to the present embodiment acquires the time-series data of the SOC in the energy storage device, and determines the ΔSOC in the time-series data and the SOC representative value and the temperature representative value such as the center SOC representing the SOC region in the ΔSOC. The shape change such as the thickness increase amount of the energy storage device is estimated based on the determined ΔSOC, SOC representative value, and temperature representative value.

First Embodiment

Hereinafter, a case where the energy storage device is a lithium ion secondary battery will be described.

Figure 7:
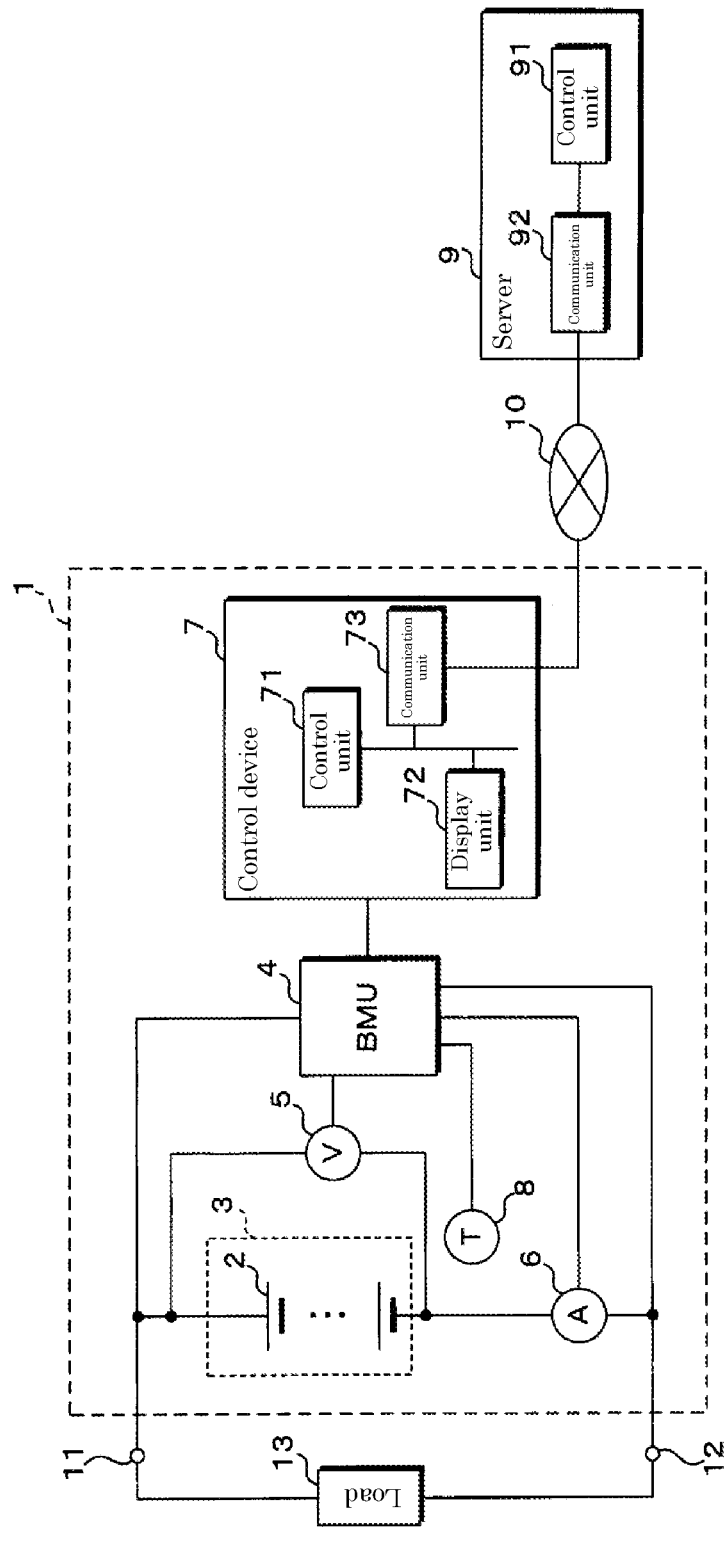
FIG. 7 is a block diagram showing a configuration of a charge-discharge system and a server according to a first embodiment.

FIG. 7 is a block diagram showing a configuration of a charge-discharge system 1 and a server 9 according to a first embodiment.

The charge-discharge system 1 includes a battery module 3, a battery management unit (BMU) 4, a voltage sensor 5, a current sensor 6, a control device 7, and a temperature sensor 8.

In the battery module 3, lithium ion secondary batteries (hereinafter, referred to as cells) 2 as a plurality of energy storage devices are connected in series. The control device 7 controls the entire charge-discharge system 1.

The server 9 includes a control unit 91 and a communication unit 92.

The control device 7 includes a control unit 71, a display unit 72, and a communication unit 73.

The control unit 71 of the control device 7 is connected to the control unit 91 via the communication unit 73, a network 10, and the communication unit 92.

A load 13 is connected to the battery module 3 via terminals 11 and 12. In the case of charging, a charger is connected to the battery module 3.

The control units 71 and 91 include, for example, a central processing unit (CPU), a read only memory (ROM), a random access memory (RAM), and the like, and control the operations of the control device 7 and the server 9, respectively.

The communication units 73 and 92 have a function of communicating with other devices via the network 10, and can transmit and receive necessary information.

The display unit 72 of the control device 7 can be configured by a liquid crystal panel, an organic electro luminescence (EL) display panel, or the like. The control unit 71 performs control for displaying necessary information on the display unit 72.

In the present embodiment, any one of the BMU 4, the control device 7, and the server 9 functions as the estimation device of the present invention. When the server 9 does not function as an estimation device, the charge-discharge system 1 may not be connected to the server 9.

Although FIG. 7 shows a case where one set of battery module 3 is provided, a plurality of sets of battery modules 3 may be connected in series.

The BMU 4 may be a battery ECU.

The voltage sensor 5 is connected in parallel to the battery module 3, and outputs a detection result corresponding to the entire voltage of the battery module 3. The voltage sensor 5 is connected to a terminal 23 of a positive electrode and a terminal 26 of a negative electrode, which will be described later, of each cell 2, measures a voltage $V_1$ between the terminals 23 and 26 of each cell 2, and detects a voltage V between a lead 33 of a negative electrode and a lead 34 of a positive electrode, which will be described later, of the battery module 3, which is a total value of $V_1$ of each cell 2.

The current sensor 6 is connected in series to the battery module 3, and outputs a detection result according to the current of the battery module 3.

The temperature sensor 8 is provided near the battery module 3 and outputs a detection result corresponding to the temperature of the battery module 3.

Figure 8:
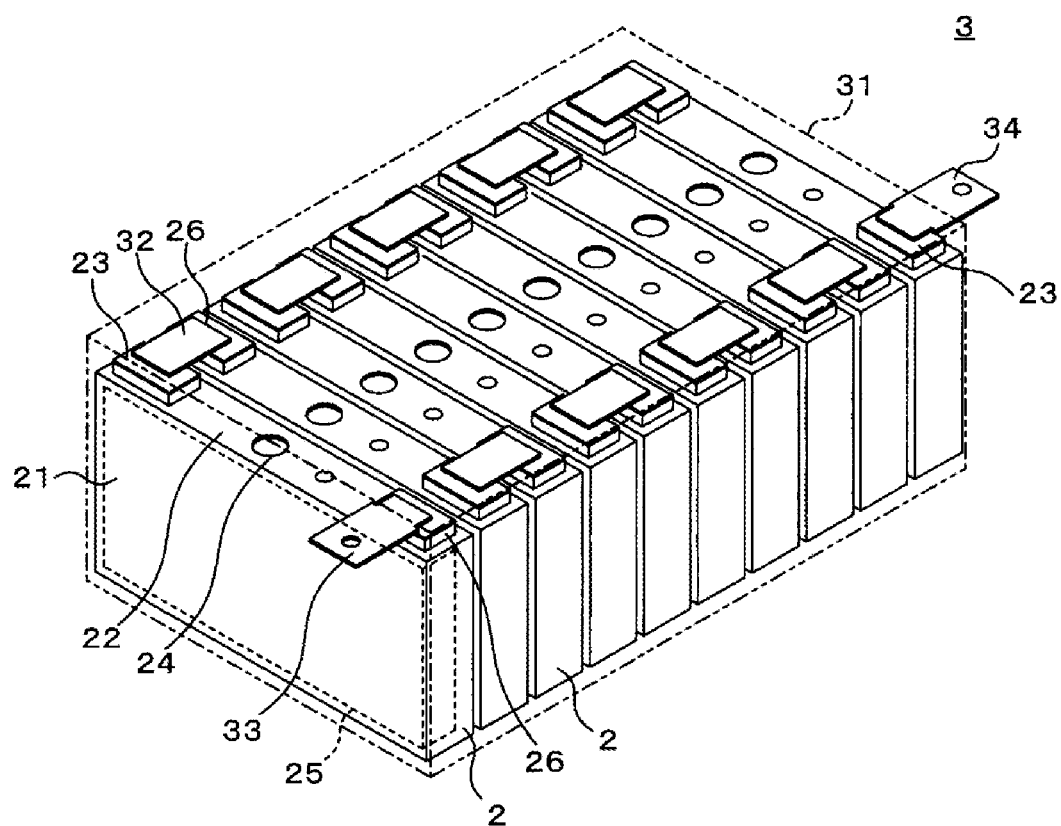
FIG. 8 is a perspective view of a battery module.

FIG. 8 is a perspective view of the battery module 3.

The battery module 3 includes a rectangular parallelepiped case 31 and a plurality of the cells 2 housed in the case 31.

The cell 2 includes a rectangular parallelepiped case body 21, a lid plate 22, the terminals 23 and 26 provided on the lid plate 22, a rupture valve 24, and an electrode assembly 25. The electrode assembly 25 is formed by laminating a positive electrode plate, a separator, and a negative electrode plate, and is housed in the case body 21.

The electrode assembly 25 may be obtained by winding a positive electrode plate and a negative electrode plate in a flat shape with a separator interposed therebetween.

The positive electrode plate is formed by forming an active material layer on a positive electrode substrate foil which is a plate-like (sheet-like) or elongated strip-like metal foil made of aluminum, an aluminum alloy, or the like. The negative electrode plate is formed by forming an active material layer on a negative electrode substrate foil which is a plate-like (sheet-like) or elongated strip-like metal foil made of copper, a copper alloy, or the like. The separator is a microporous sheet made of a synthetic resin.

The positive active material used for the active material layer of the positive electrode is, for example, a layered oxide represented by $Li_x(Ni_aMn_bCo_cM_d)O_2$ (M is a metal element other than Li, Ni, Mn, and Co, 0≤a<1, 0≤b<1, 0≤c<1, a+b+c+d=1, 0<x≤1.1, and a and c are not 0 at the same time.). The positive active material has a layered rock salt-type crystal structure. The a may satisfy 0.5≤a≤1. In this case, the transition metal site contains a large amount of Ni.

The positive active material is preferably NCM represented by $Li_x(Ni_aCo_cMn_b)O_2$ (a+b+c=1) with d=0. The NCM may be NCM 111 (a:b:c=1:1:1), NCM 523 (a:b:c=5: 2:3) having a high Ni content, or the like.

The positive active material may be NCA represented by $Li_x(Ni_aCo_cAl_d)O_2$ in which M is Al and b=0 (a+c+d=1).

In NCM or NCA, the metal other than Li and Ni is not limited to two kinds of metals, and may be made of three or more kinds of metals. For example, a small amount of Ti, Nb, B, W, Zr, Ti, Mg, or the like may be contained.

The positive active material may be, for example, a Li-excess active material such as a $LiMeO_2$—$Li_2MnO_3$ solid solution, a $Li_2O$—$LiMeO_2$ solid solution, a $Li_3NbO_4$—$LiMeO_2$ solid solution, a $Li_4WO_5$—$LiMeO_2$ solid solution, a $Li_4TeO_5$—$LiMeO_2$ solid solution, a $Li_3SbO_4$—$LiFeO_2$ solid solution, a $Li_2RuO_3$—$LiMeO_2$ solid solution, or a $Li_2RuO_3$—$Li_2MeO_3$ solid solution.

The positive active material is not limited to the above case.

Examples of the negative active material used for the negative active material layer include hard carbon, metals or alloys such as Si, Sn, Cd, Zn, Al, Bi, Pb, Ge, and Ag, chalcogenides containing these metals, and the like. An example of the chalcogenide is SiO.

The adjacent terminals 23 and 26 of the adjacent cells 2 of the battery module 3 are electrically connected by a bus bar 32, so that the plurality of cells 2 are connected in series.

The terminals 23 and 26 of the cells 2 at both ends of the battery module 3 are provided with the leads 34 and 33 for extracting electric power.

Figure 9:
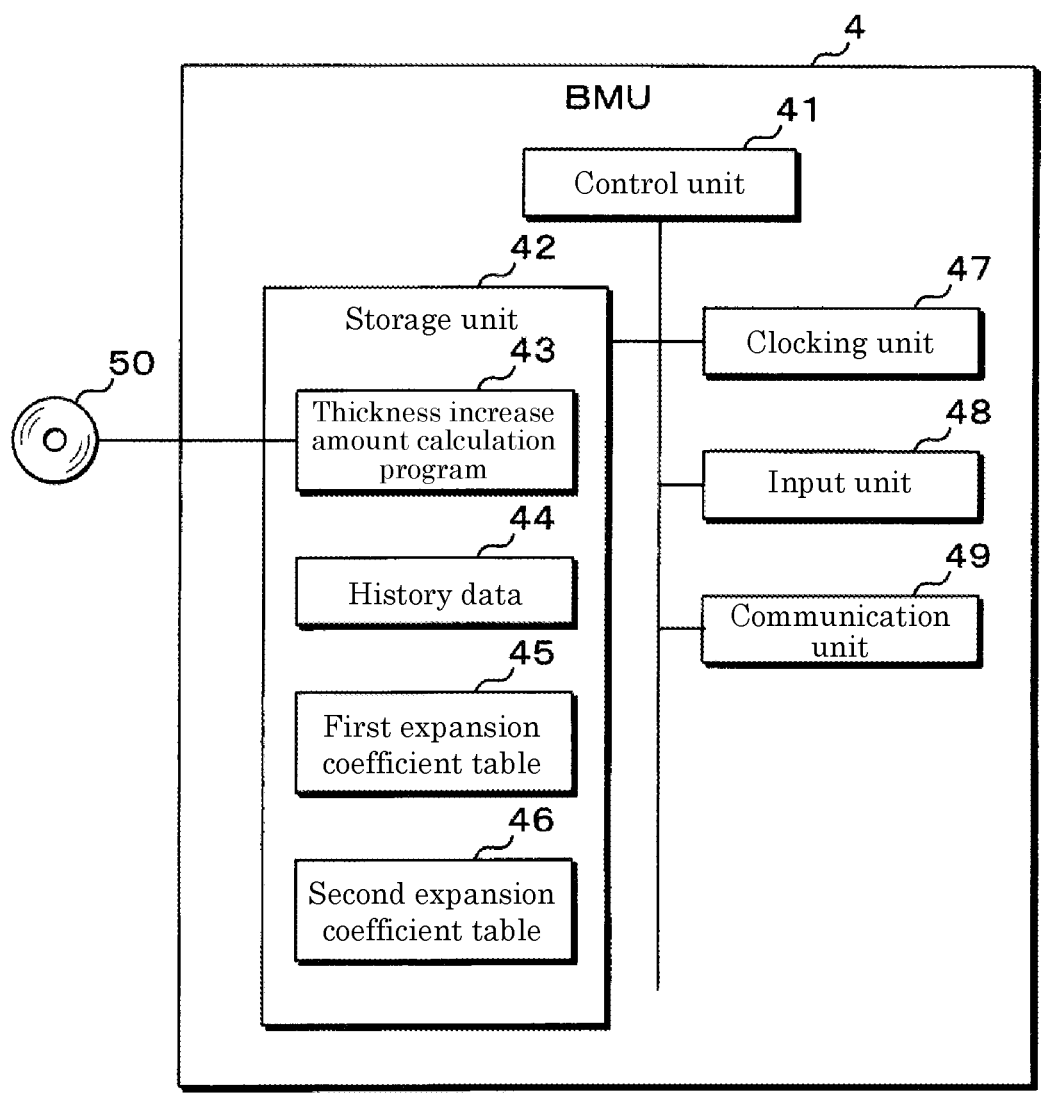
FIG. 9 is a block diagram showing a configuration of a BMU.

FIG. 9 is a block diagram showing a configuration of the BMU 4. The BMU 4 includes a control unit 41, a storage unit 42, a clocking unit 47, an input unit 48, and a communication unit 49. These units are communicably connected to each other via a bus.

The control unit 41 has the same configuration as the control unit 71.

The control unit 41 functions as a processing unit that executes processing of calculating the thickness increase amount by reading and executing a thickness increase amount calculation program 43 to be described later.

The clocking unit 47 counts the elapsed time.

The input unit 48 receives inputs of detection results from the voltage sensor 5, the current sensor 6, and the temperature sensor 8.

The communication unit 49 has a function of communicating with other devices via the network 10, and can transmit and receive necessary information.

The storage unit 42 includes, for example, a hard disk drive (HDD) and stores various programs and data. The storage unit 42 stores the thickness increase amount calculation program 43. The thickness increase amount calculation program 43 is provided in a state of being stored in a computer-readable recording medium 50 such as a CD-ROM, a DVD-ROM, or a USB memory, for example, and is stored in the storage unit 42 by being installed in the BMU 4. In addition, the thickness increase amount calculation program 43 may be acquired from an external computer (not shown) connected to a communication network and stored in the storage unit 42.

The storage unit 42 also stores charge-discharge history data 44. The charge-discharge history is an operation history of the battery module 3, and is information including information indicating a period (use period) during which the battery module 3 performs charge or discharge, information on charge or discharge performed by the battery module 3 during the use period, and the like. The information indicating the use period of the battery module 3 is information including information indicating start and end points of charge or discharge, an accumulated use period in which the battery module 3 is used, and the like. The information on charge or discharge performed by the battery module 3 is information indicating a voltage, a rate, and the like during charge or discharge performed by the battery module 3.

The storage unit 42 also stores a first expansion coefficient table 45 and a second expansion coefficient table 46.

As shown in FIG. 5, the relationship between the total SOC and the thickness increase amount is obtained in advance by experiment for each of the plurality of ΔSOCs and the center SOC for each temperature of the battery module 3, and the control unit 41 calculates a coefficient of an approximate curve of the relationship as a first expansion coefficient. The first expansion coefficient table 45 stores a plurality of ΔSOCs and the center SOC and corresponding first expansion coefficients for each temperature. In this case, a table of temperatures corresponding to the determined temperature representative value is selected, and the first expansion coefficient is determined based on the ΔSOC and the center SOC determined based on the time-series data of the SOC. If there is no table of the corresponding temperature, interpolation calculation is performed between the tables.

When the first expansion coefficient can be expressed by the Arrhenius plot, the first expansion coefficient table and the Arrhenius plot at a predetermined temperature are stored in the first expansion coefficient table 45. The first expansion coefficient is determined based on the determined ΔSOC and center SOC, and the first expansion coefficient (T) subjected to temperature correction by the Arrhenius plot is obtained.

When the temperature representative value of the battery module 3 is estimated to be constant from the load pattern (use pattern) or the like of the battery module 3, the first expansion coefficient table corresponding to the temperature representative value may be stored.

The first expansion coefficient table 45 may store the first expansion coefficient as a function of the ΔSOC and the center SOC.

As shown in FIG. 3, the relationship between time and the thickness increase amount may be obtained in advance by experiment for each of the plurality of ΔSOCs and the center SOC, and a coefficient of an approximate curve of the relationship may be obtained as the first expansion coefficient and stored in the first expansion coefficient table 45.

The first expansion coefficient can be interpolated by interpolation calculation.

The relationship between time and the thickness increase amount is obtained in advance by experiment for each of the plurality of temperatures and SOCs at the time of standing, and the control unit 41 calculates a coefficient of an approximate curve of the relationship as a second expansion coefficient. The second expansion coefficient table 46 stores a plurality of temperatures, SOCs at the time of standing, and corresponding second expansion coefficients.

Figure 10:
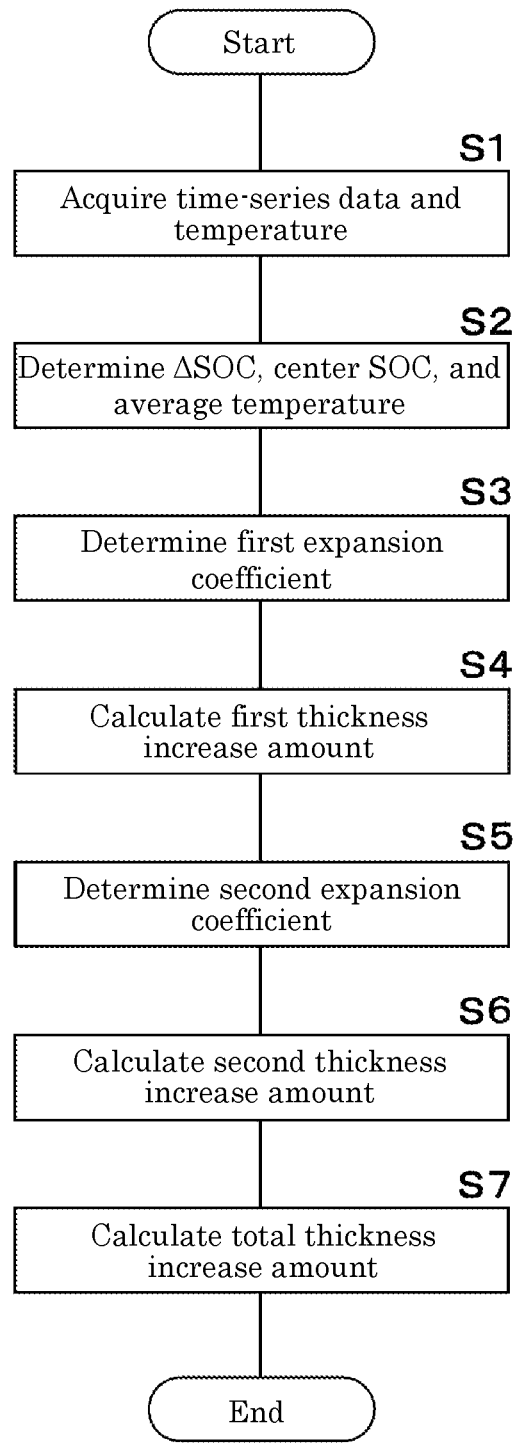
FIG. 10 is a flowchart showing a procedure of calculation processing of a thickness increase amount by a control unit.

FIG. 10 is a flowchart showing a procedure of calculation processing of the thickness increase amount by the control unit 41.

The control unit 41 acquires the time-series data of the SOC in the predetermined period and the temperature of the battery module 3 (S1). The temperature may be acquired as time series data.

The control unit 41 determines the ΔSOC, the center SOC as the representative SOC, and the average temperature as the temperature representative value (S2). A determination method of the ΔSOC and the center SOC will be described later.

The control unit 41 reads the first expansion coefficient table 45 corresponding to the average temperature, and determines the first expansion coefficient based on the determined ΔSOC and center SOC (S3). In a case where the Arrhenius plot is stored instead of storing the first expansion coefficient table for each average temperature, the control unit 41 obtains the first expansion coefficient (T) corrected to the temperature at the time of calculation by the Arrhenius plot with respect to the determined first expansion coefficient.

Figures 11, 12:
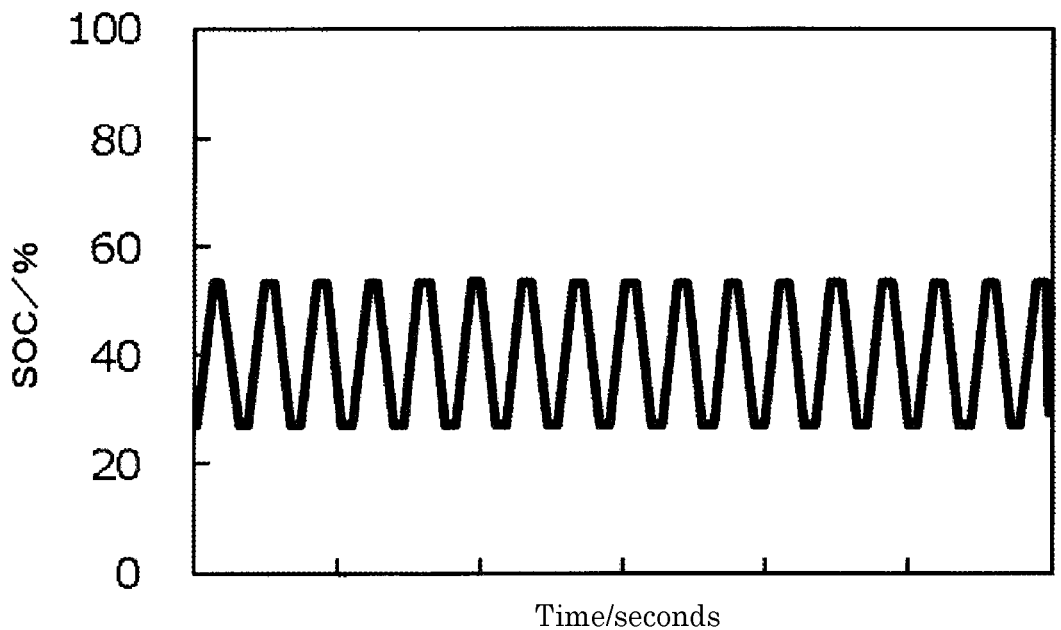
FIG. 11 is a graph showing fluctuation data of an SOC.
FIG. 12 is a diagram showing an example of a first expansion coefficient table.

An example of determination of the first expansion coefficient will be described. FIG. 11 is a graph showing fluctuation data of the SOC. The horizontal axis represents time (seconds), and the vertical axis represents SOC (%). From FIG. 11, the center SOC is 40%, and the ΔSOC is 25%. FIG. 12 shows an example of the first expansion coefficient table 45. When the center SOC is 40% and the ΔSOC is 25%, a first expansion coefficient k7d is determined from the first expansion coefficient table 45. Here, the ΔSOC refers to a fluctuation amount during charge or discharge.

The control unit 41 calculates a first thickness increase amount based on the determined first expansion coefficient and the total SOC (S4).

The first thickness increase amount is represented by a function of the total SOC with the first expansion coefficient as a factor. When, for each temperature, the coefficient of the approximate curve of the relationship between time and the thickness increase amount obtained for each of the plurality of ΔSOCs and the center SOC is obtained as the first expansion coefficient and stored in the first expansion coefficient table 45, the first thickness increase amount is represented by a function of time with the first expansion coefficient as a factor.

The control unit 41 reads the second expansion coefficient table 46 and determines the second expansion coefficient based on the average temperature and the SOC at the time of standing (S5).

The control unit 41 calculates a second thickness increase amount based on the determined second expansion coefficient and time (S6). The second thickness increase amount is represented by a function of time (or √ time) with the second expansion coefficient as a factor.

The control unit 41 adds the second thickness increase amount to the first thickness increase amount to calculate a total thickness increase amount (S7), and ends the processing.

Hereinafter, a method of determining the ΔSOC and the center SOC will be specifically described.

Figure 13:
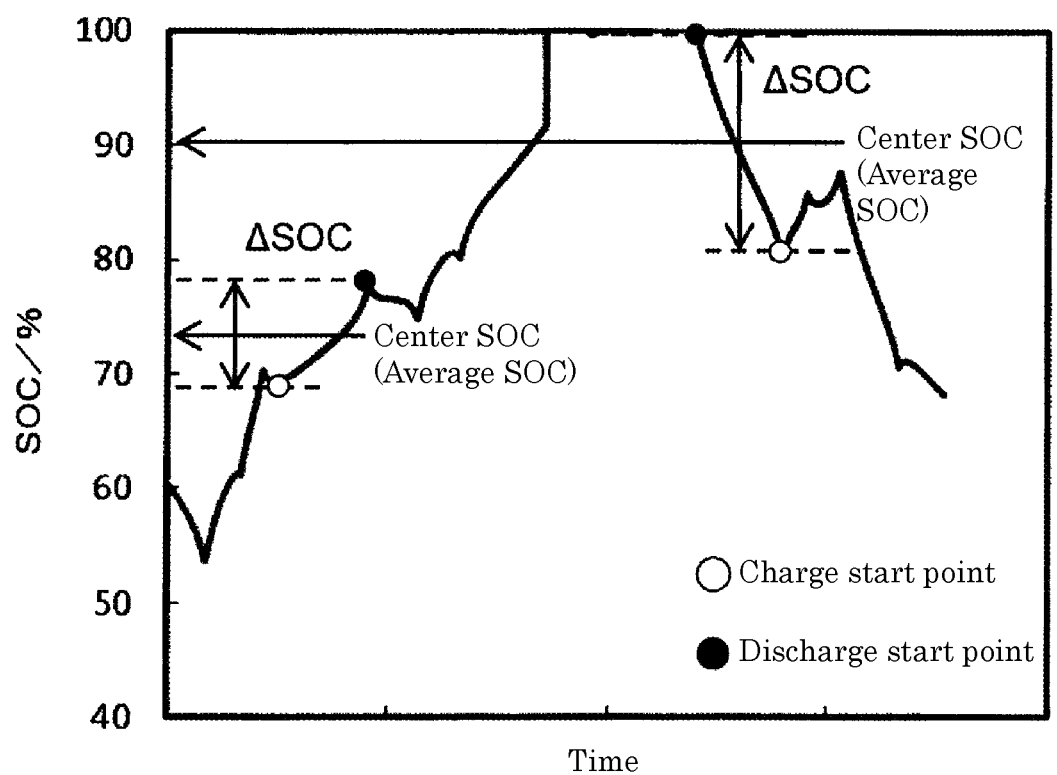
FIG. 13 is an explanatory diagram of a method of determining ΔSOC and center SOC from a start point of charge and discharge of the fluctuation data of the SOC.

FIG. 13 is an explanatory diagram showing a method of determining the ΔSOC and the center SOC from the start point of charge and discharge of the fluctuation data of the SOC. The horizontal axis represents time, and the vertical axis represents SOC (%).

The control unit 41 acquires the charge start point and the discharge start point from the fluctuation data of the SOC.

The control unit 41 determines the difference between the SOC at the charge start point and the SOC at the discharge start point as ΔSOC.

The control unit 41 determines the average SOC between the charge start point and the discharge start point as the center SOC, and determines the average temperature as the temperature representative value.

Figure 14:
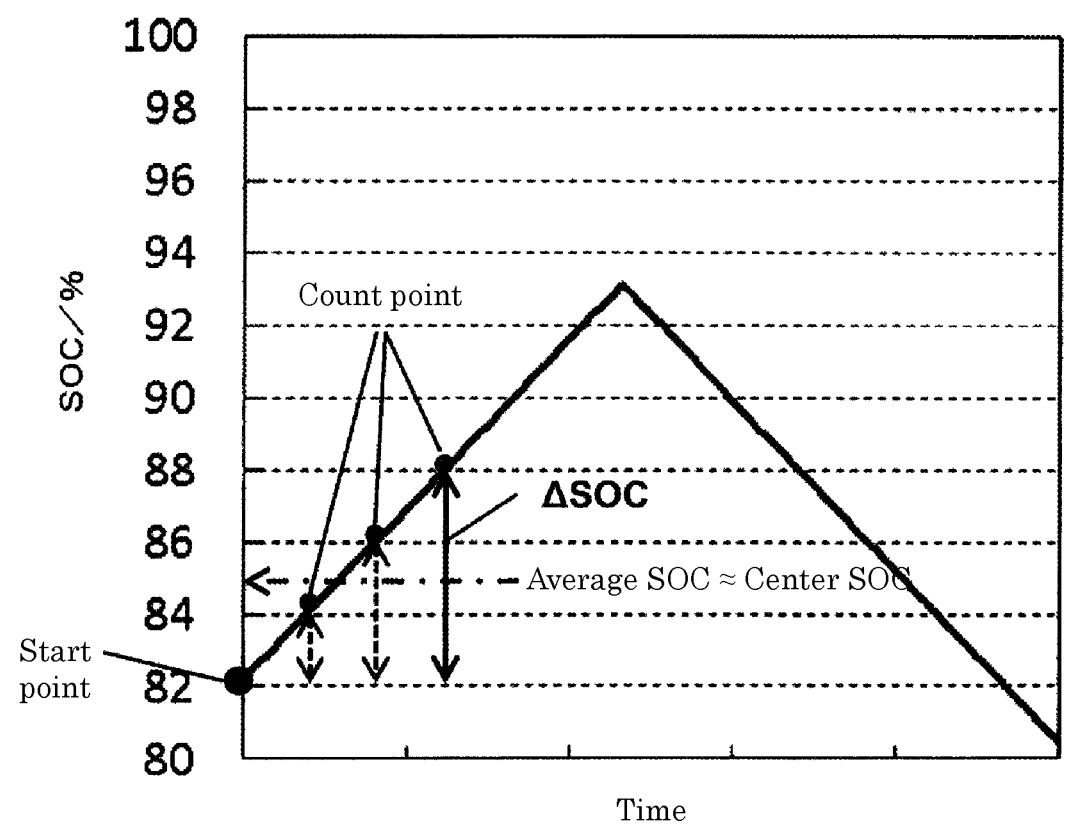
FIG. 14 is an explanatory diagram of a method of determining the ΔSOC and the center SOC by counting every time the SOC reaches a threshold from the start point based on the fluctuation data of the SOC.

FIG. 14 is an explanatory diagram showing a method of determining the ΔSOC and the center SOC by counting every time the SOC reaches the threshold from the start point based on the fluctuation data of the SOC. The horizontal axis represents time, and the vertical axis represents SOC (%).

The control unit 41 calculates the ΔSOC and the center SOC each time the change amount of the SOC increases or decreases by 2%.

The control unit 41 determines the change amount of the SOC from the start point to the count point as ΔSOC.

The control unit 41 determines the average SOC from the start point to the count point as the center SOC, and determines the average temperature as the temperature representative value.

Next, a case where the standard deviation and the average value of the SOC are calculated based on the time-series data, and the calculated standard deviation and average value are determined as the ΔSOC and the center SOC will be described.

Figure 15:
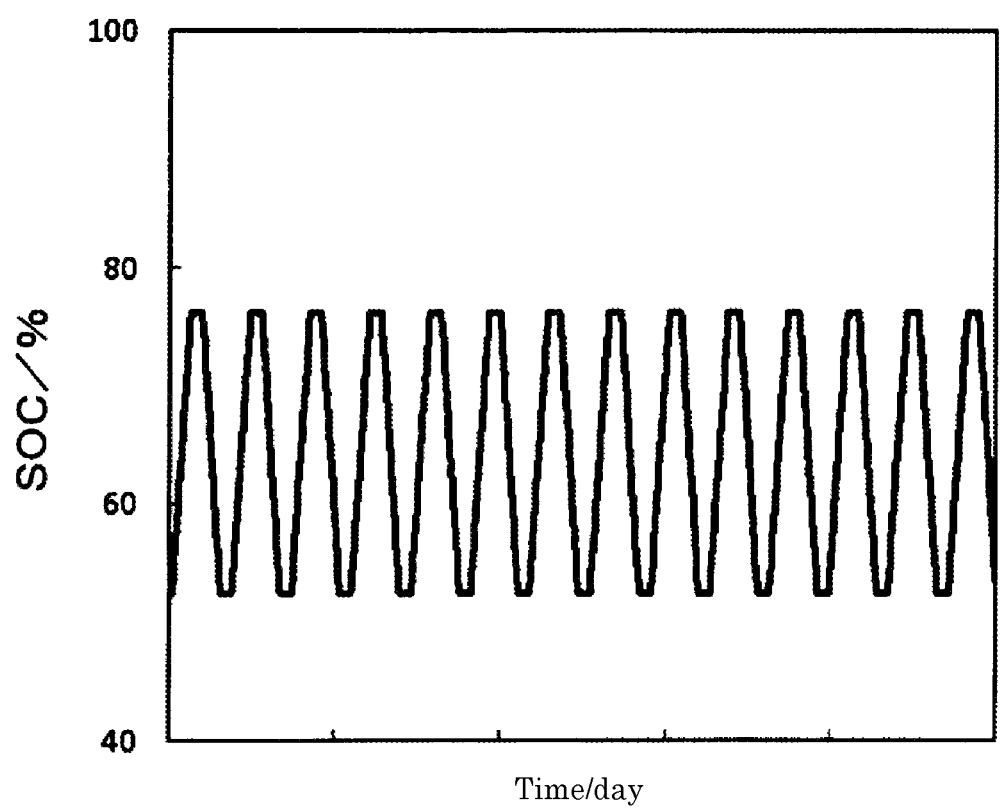
FIG. 15 is a graph showing fluctuation data of the SOC.

FIG. 15 is a graph showing fluctuation data of the SOC, where the horizontal axis represents time (day) and the vertical axis represents SOC (%).

The control unit 41 extracts data of a period for calculating the thickness increase amount from the fluctuation data of the SOC.

Figure 16:
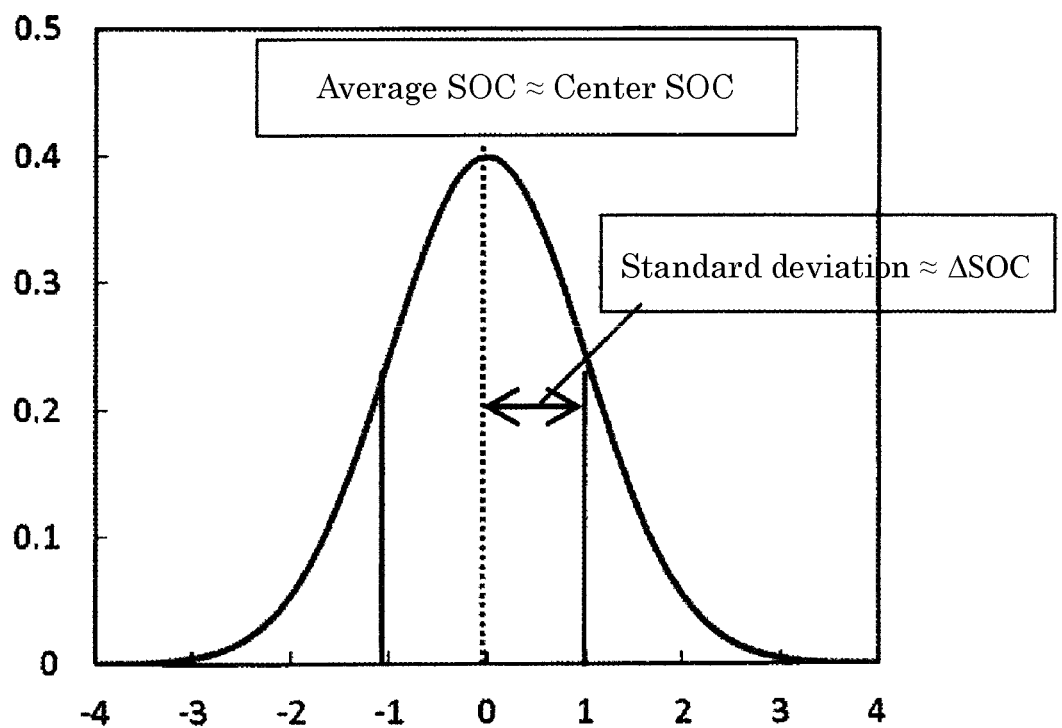
FIG. 16 is an explanatory diagram of a method of calculating a standard deviation and an average value of the SOC.

FIG. 16 is an explanatory diagram for explaining a method of calculating the standard deviation and the average value of the SOC.

The control unit 41 calculates the standard deviation and the average value of the SOC.

The control unit 41 reads the first expansion coefficient table 45 and determines the first expansion coefficient.

Figure 17:
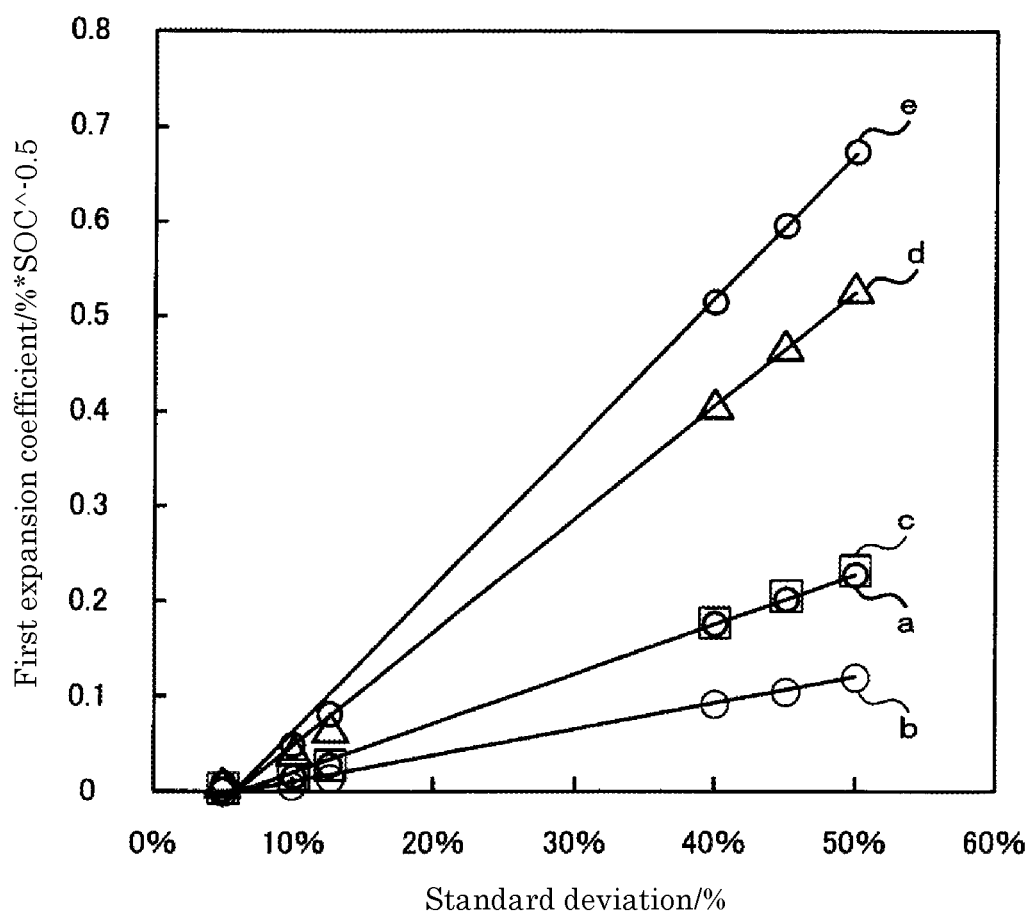
FIG. 17 is a graph showing a relationship among the standard deviation, the average SOC, and the first expansion coefficient stored in the first expansion coefficient table.

FIG. 17 is a graph showing the relationship among the standard deviation, the average SOC, and the first expansion coefficient stored in the first expansion coefficient table 45 for each temperature. The horizontal axis represents the standard deviation (%), and the vertical axis represents the first expansion coefficient (% hl SOC). The relationship between the standard deviation and the first expansion coefficient is obtained for each of cases a, b, c, d, and e where the average SOC is 12.5%, 37.5%, 62.5%, 87.5%, and 100%. The control unit 41 refers to the first expansion coefficient table 45 corresponding to the average temperature, and determines the first expansion coefficient based on the standard deviation and the average SOC determined as shown in FIG. 16. The control unit 41 may perform temperature correction on the first expansion coefficient by the Arrhenius plot.

Figure 18:
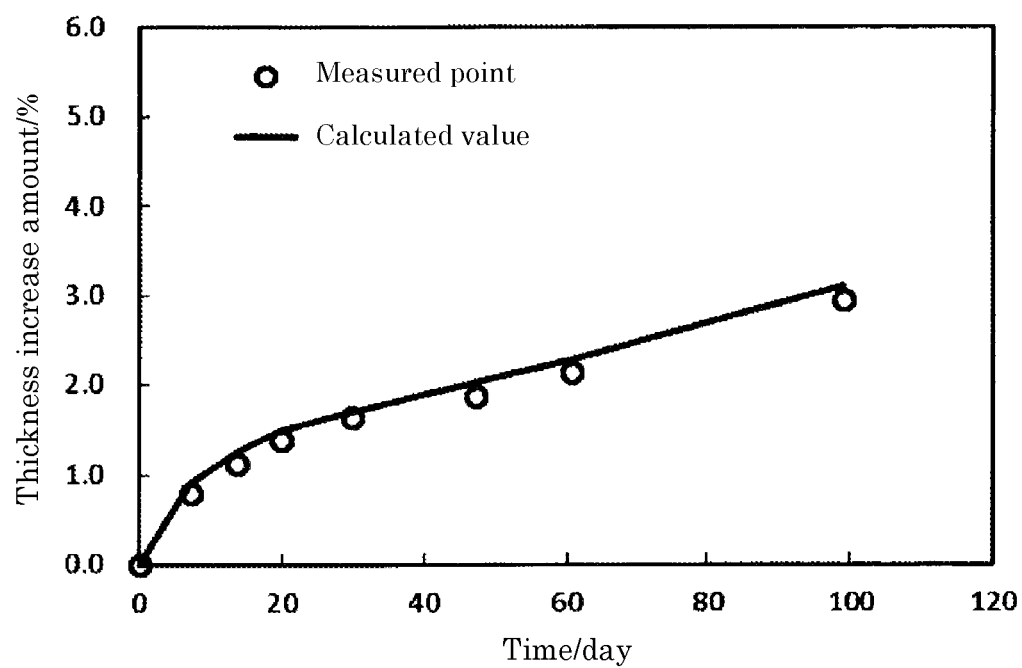
FIG. 18 is an explanatory diagram of a method of calculating the thickness increase amount based on the determined first expansion coefficient and time.

FIG. 18 is an explanatory diagram of a method of calculating the thickness increase amount based on the determined first expansion coefficient and time. The horizontal axis represents time (day), and the vertical axis represents a thickness increase amount (%).

The calculated value of the thickness increase amount is shown in a graph. The measured values are also shown. It can be seen from FIG. 18 that the calculated value matches the measured value.

Next, a case where the waveform of the fluctuation of the SOC in the time-series data is converted into a frequency component, and the amplitude of the converted frequency component is determined as a fluctuation range and the frequency is determined as a total SOC will be described.

Figure 19:
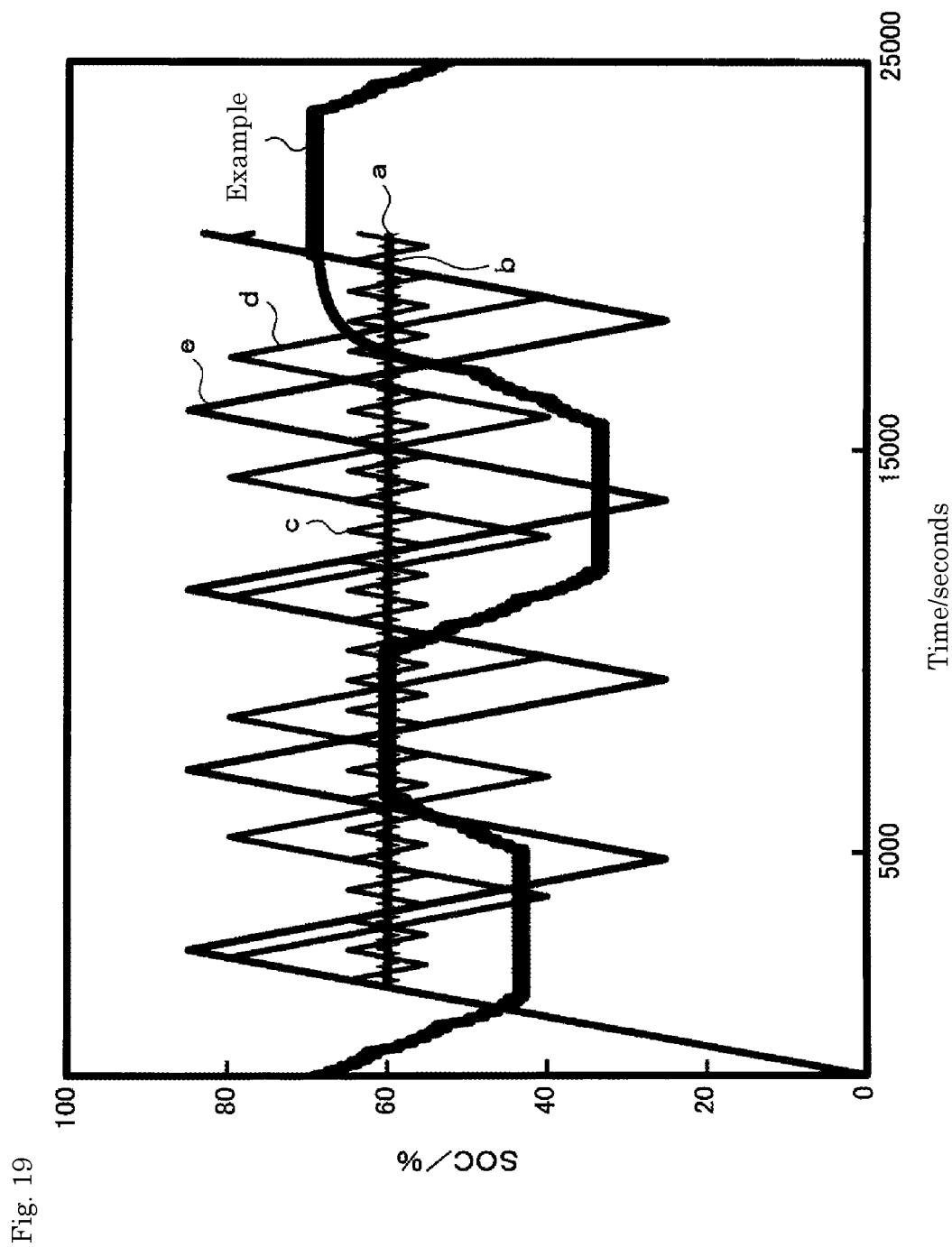
FIG. 19 is a graph showing a relationship between the time and the SOC when the SOC is varied by Δ 0.5%, Δ 1.5%, Δ 5%, Δ 20%, and Δ 30%.

FIG. 19 is a graph showing the relationship between the time and the SOC when the SOC is varied by A 0.5%, A 1.5%, A 5%, A 20%, and A 30% at a predetermined temperature. The horizontal axis represents time [seconds], and the vertical axis represents SOC [%]. In FIG. 19, graphs when the SOC is varied by A 0.5%, A 1.5%, A 5%, A 20%, and A 30% are indicated by a, b, c, d, and e. FIG. 19 also shows the fluctuation (example) of the SOC when the energy storage device is actually used.

Figure 20:
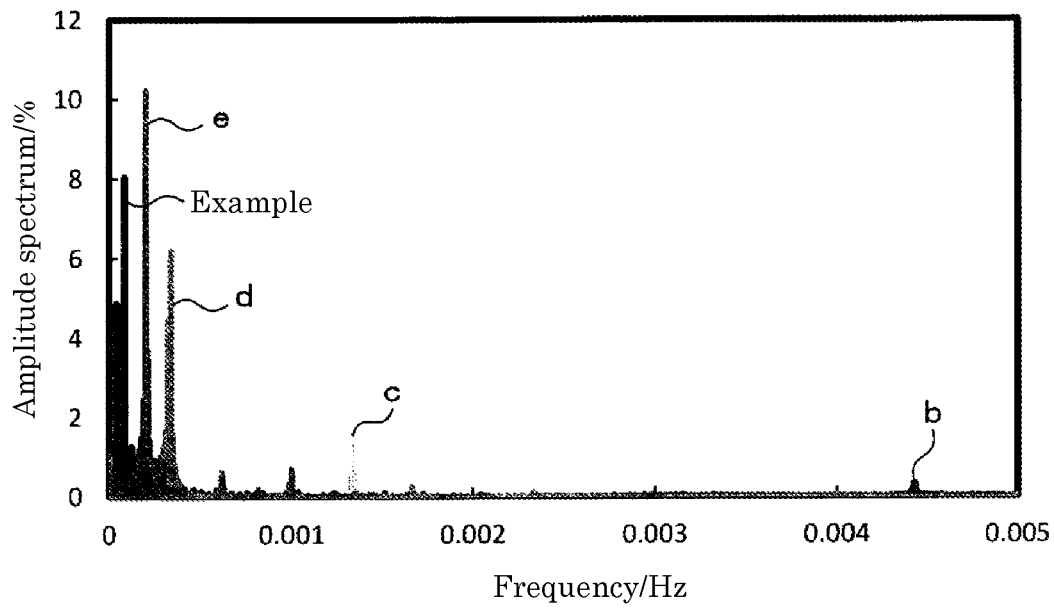
FIG. 20 is a graph obtained by performing Fourier transform on the waveform of FIG. 19 and decomposing the waveform into waveform components in a plurality of frequency regions.

FIG. 20 is a graph in which the waveform of FIG. 19 is Fourier-transformed and converted into waveform components in a plurality of frequency regions. The horizontal axis represents the frequency [Hz], and the vertical axis represents the amplitude spectrum [%].

Waveform components corresponding to the waveforms of b, c, d, and e in FIG. 19 are shown, and waveform components obtained by converting the waveforms of Examples are also shown. Among waveform components corresponding to the waveform of a of FIG. 19, a peak component has a frequency of about 0.013 and an amplitude of about 0.133, and is not shown in FIG. 20.

The first expansion coefficient table 45 stores the relationship between the amplitude spectrum and the frequency of the main peak of the frequency component and the first expansion coefficient for each temperature. First, the first relationship between the time (days) and the thickness increase amount when the SOC fluctuates in the patterns a, b, c, d, and e in FIG. 19 is obtained.

Figure 21:
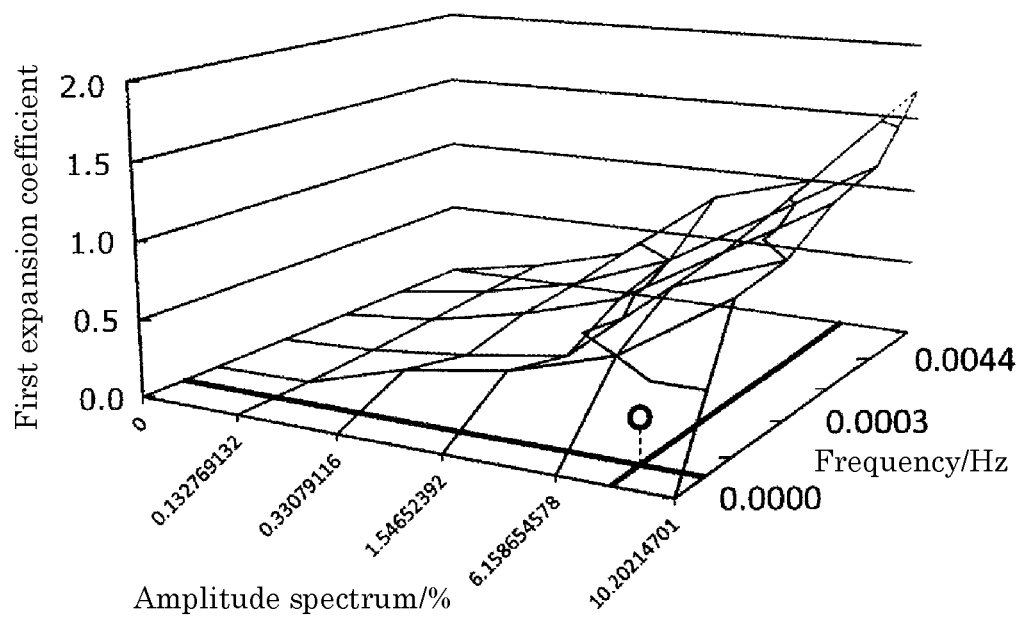
FIG. 21 is a graph showing a relationship among an amplitude spectrum, a frequency, and the first expansion coefficient.

FIG. 21 is a graph showing a second relationship among the amplitude spectrum, the frequency, and the first expansion coefficient. In FIG. 21, an x-axis represents an amplitude spectrum [%], a y-axis represents a frequency [Hz], and a z-axis represents a first expansion coefficient. The second relationship indicates the frequency and the amplitude spectrum of the peak top of each waveform of a, b, c, d, and e in FIG. 20 in association with the first expansion coefficient obtained from the approximate curve of the first relationship. In FIG. 21, when the amplitude spectrum is about 10.2% and the amplitude is about $2\times10^{-4}$, the first expansion coefficient is about 0.94. The graph of FIG. 21 shows a case where interpolation is performed by interpolation calculation. In the case of FIG. 21, for waveforms other than the waveforms of a, b, c, d, and e of FIG. 20, the first expansion coefficient can be obtained by reading the values on the z axis corresponding to the amplitude spectrum and frequency of the waveform. In the example of FIG. 20, the main peak has an amplitude spectrum of 8.02% and an amplitude of about $8.4\times10^{-5}$, and the first expansion coefficient is determined as about 0.19 by reading the z coordinate of the point ○. In the case of obtaining the first expansion coefficient, weighting may be performed on a waveform component having higher strength than a waveform component having lower strength.

Figure 22:
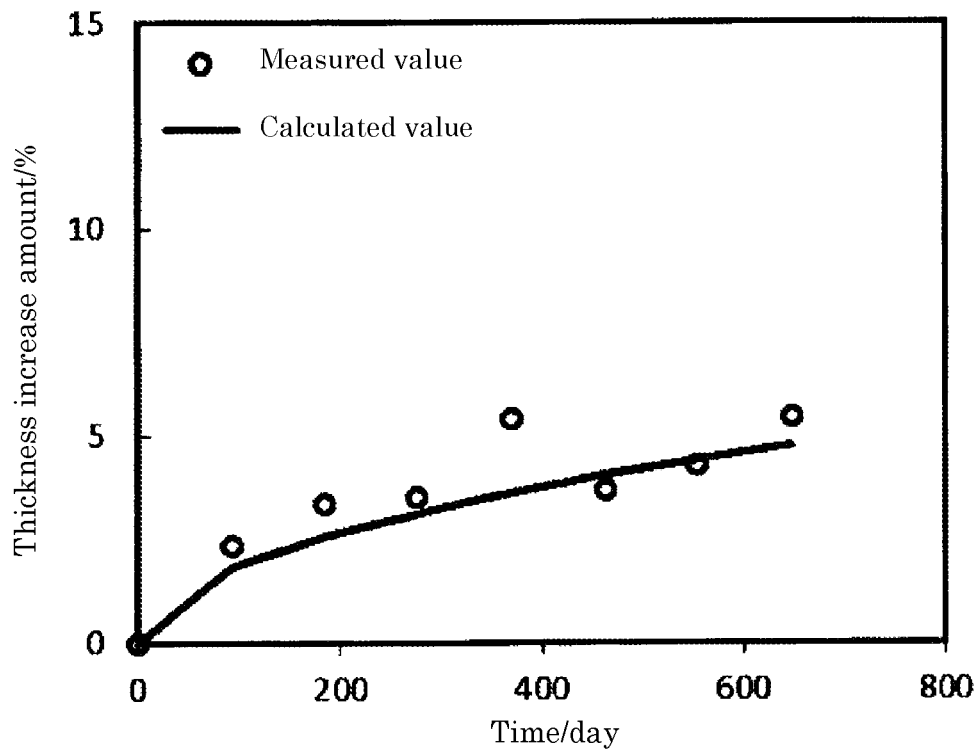
FIG. 22 is a graph showing a relationship between time and a thickness increase amount.

FIG. 22 is a graph showing a relationship between time and a thickness increase amount at the predetermined temperature. In FIG. 22, the horizontal axis represents time (day), and the vertical axis represents the thickness increase amount (%). The calculated value indicates the relationship between time and the thickness increase amount when the first expansion coefficient is 0.19.

The experimental value is obtained by plotting the thickness increase amount at each of a plurality of measurement time points. From FIG. 22, it was confirmed that the estimation can be satisfactorily performed by the estimation method of the present embodiment.

As described above, it has been confirmed that the waveform of the fluctuation of the SOC is converted into waveform components in a plurality of frequency regions, and the thickness increase amount of the energy storage device can be accurately estimated based on each waveform component and the first expansion coefficient.

Hereinafter, the results of obtaining the transition of the energized thickness increase amount are shown.

Figure 23:
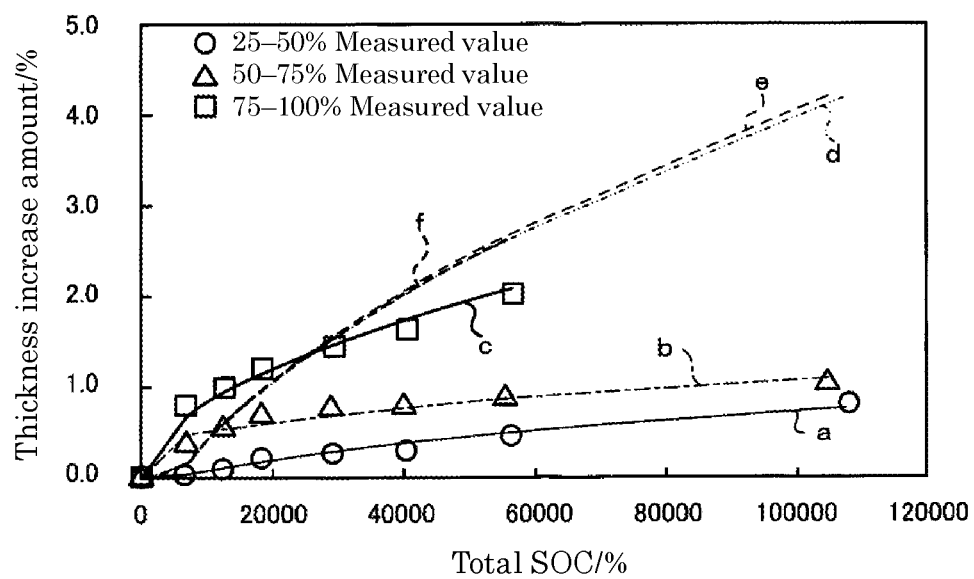
FIG. 23 is a graph showing a result of obtaining a relationship between a total SOC and a thickness increase amount when the ΔSOC is the same and the center SOC is different.

FIG. 23 is a graph showing a result of obtaining a relationship between the total SOC and the thickness increase amount when the ΔSOC is the same and the center SOC is different. The thickness increase amount was calculated by the method of the present embodiment for the case where the SOC fluctuated at 25 to 50%, the case where the SOC fluctuated at 50 to 75%, and the case where the SOC fluctuated at 75 to 100% (Examples a, b, and c). For each of the above cases, the thickness increase amount was calculated by the conventional method of Patent Document 1 (Comparative Examples d, e, and f). In FIG. 23, the measured value is obtained by plotting the thickness increase amounts at a plurality of measurement points.

As can be seen from FIG. 23, in the cases of Comparative Examples d, e, and f, the thickness increase amount is calculated as substantially the same value even when the center SOC is different, whereas in the cases of Examples a, b, and c, the thickness increase amount approximate to the measured value is calculated corresponding to each center SOC, and the calculation accuracy is high.

Figure 24:
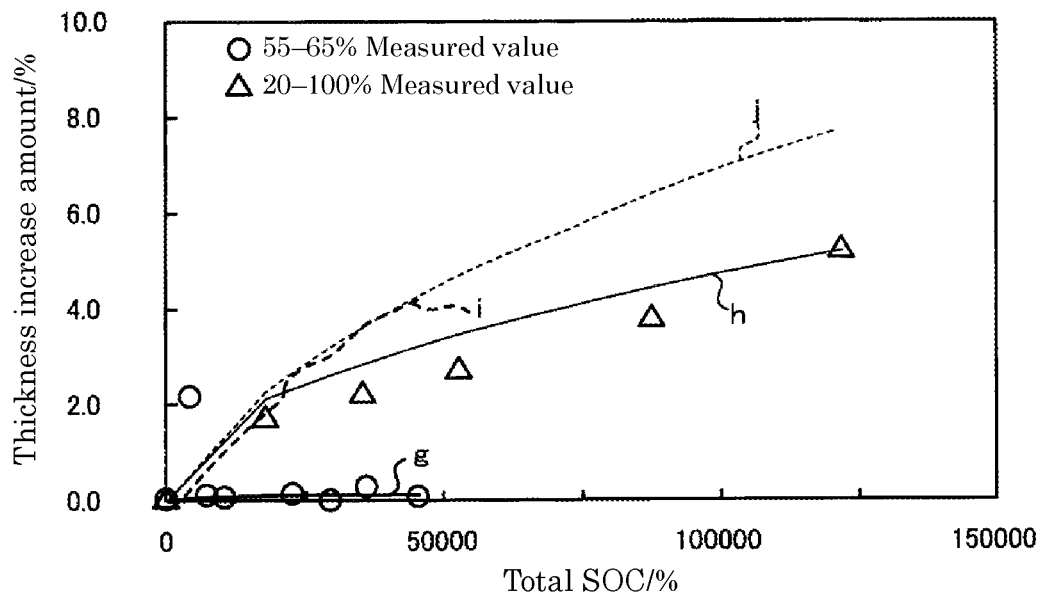
FIG. 24 is a graph showing a result of obtaining a relationship between the total SOC and the thickness increase amount when the center SOC is the same and the ΔSOC is different.

FIG. 24 is a graph showing a result of obtaining a relationship between the total SOC and the thickness increase amount when the center SOC is the same and the ΔSOC is different. The thickness increase amount was calculated according to the present embodiment for each of the case where the SOC fluctuated at 55 to 65% and the case where the SOC fluctuated at 20 to 100% (Examples g and h). For each of the above cases, the thickness increase amount was calculated by the method of Patent Document 1 (Comparative Examples i and j). In FIG. 24, the measured value is obtained by plotting the thickness increase amounts at a plurality of measurement points.

As can be seen from FIG. 24, in the cases of Comparative Examples i and j, the thickness increase amount is calculated as substantially the same value even when the ΔSOC is different, whereas in the cases of Examples g and h, the thickness increase amount approximate to the measured value is calculated corresponding to each ΔSOC, and the calculation accuracy is high.

Figure 25:
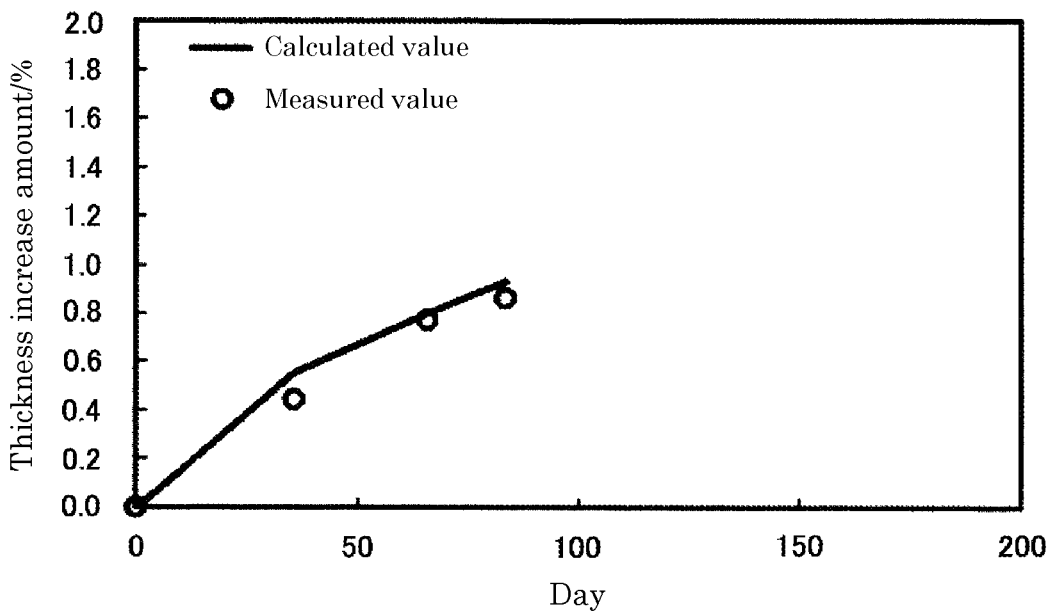
FIG. 25 is a graph showing a result of calculating a relationship between time and a thickness increase amount when charge and discharge are repeated in a short time, and the ΔSOC and the center SOC have complicated fluctuation patterns different from each other.

FIG. 25 is a graph showing a result of calculating a relationship between time and a thickness increase amount when charge and discharge are repeated in a short time, and the ΔSOC and the center SOC have complicated fluctuation patterns different from each other. The horizontal axis represents time (day), and the vertical axis represents a thickness increase amount (%). The environmental temperature is 20° C. In FIG. 25, the measured value is obtained by plotting the thickness increase amounts at a plurality of measurement time points.

As can be seen from FIG. 25, the thickness increase amount can be accurately calculated by the method of the present embodiment.

Figure 26:
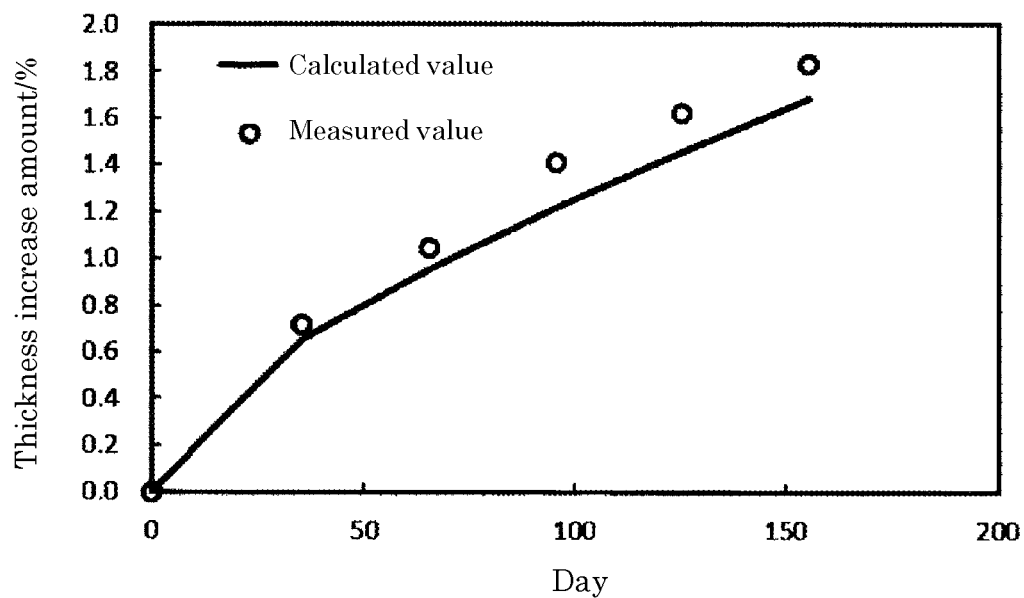
FIG. 26 is a graph showing a result of obtaining a relationship between time and a thickness increase amount in a case of a complicated fluctuation pattern.

FIG. 26 is a graph showing a result of obtaining a relationship between time and the thickness increase amount in a case of a complicated fluctuation pattern as described above. The horizontal axis represents time (day), and the vertical axis represents a thickness increase amount (%). The environmental temperature is 25° C. In FIG. 26, the measured value is obtained by plotting the thickness increase amounts at a plurality of measurement time points.

As can be seen from FIG. 26, the thickness increase amount can be accurately calculated by the method of the present embodiment.

As described above, according to the present embodiment, the thickness increase amount of the battery module 3 is estimated based on the determined ΔSOC and center SOC, that is, the estimation is performed in consideration of the use range of the SOC in which the battery module 3 is used, and thus, the estimation accuracy is good including the case where the fluctuation pattern of the SOC is complicated.

Since the shape change of the battery module 3 can be accurately estimated, it is also possible to design the battery module 3 so as to maximize the performance of the cell 2, and to apply the model-based development to the device on which the battery module 3 is mounted.

Second Embodiment

In a second embodiment, the control unit 41 estimates the remaining life of the battery module 3 based on the estimated thickness increase amount.

Figure 27:
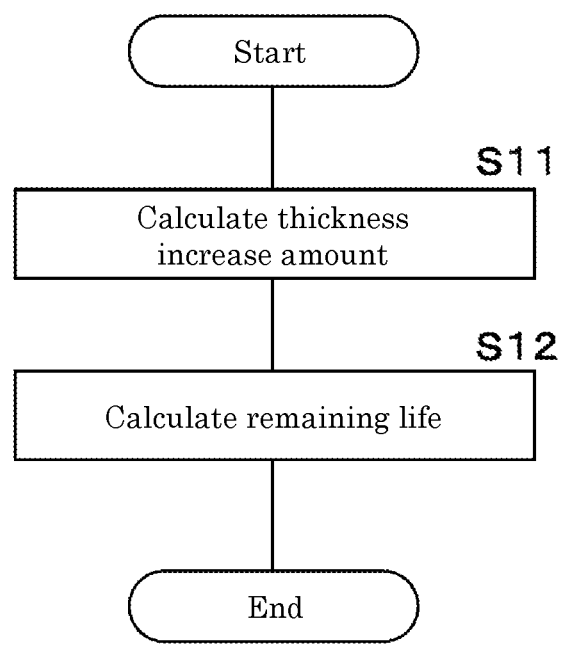
FIG. 27 is a flowchart showing a processing procedure when the control unit predicts the remaining life of the battery module.

FIG. 27 is a flowchart showing a processing procedure when the control unit 41 predicts the remaining life of the battery module 3.

The control unit 41 calculates the thickness increase amount as described above (S11). Based on the ΔSOC, the center SOC, and the time, for example, as shown in FIG. 26, the control unit 41 generates a graph of the thickness increase amount which is a function of time with the first expansion coefficient as a factor.

The control unit 41 calculates the remaining life of the battery module 3 (S12). The control unit 41 reads the time when the thickness increase amount exceeds the threshold on the curve in FIG. 26, for example, and subtracts the time up to the present from the read time to obtain the remaining life.

In the present embodiment, it is possible to predict the future thickness increase amount based on the graph of the estimation of the thickness increase amount, predict the remaining life, and perform management such as replacement of the battery module 3.

Third Embodiment

In a third embodiment, as the shape change of the energy storage device, the increase amount of the pressing force for pressing the energy storage device is estimated.

Figure 28:
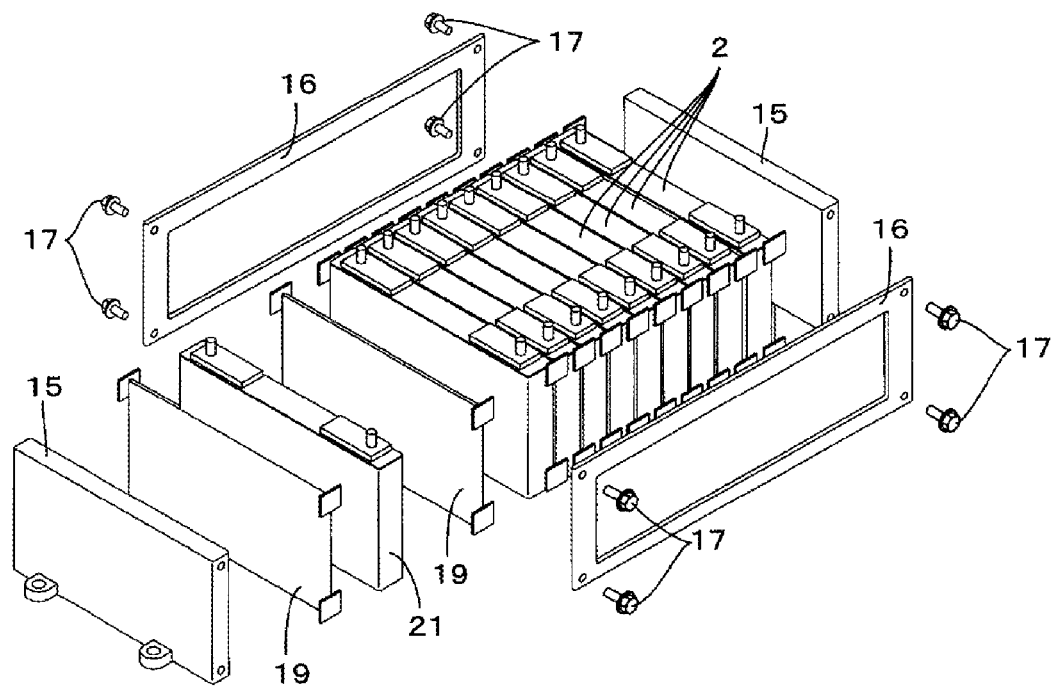
FIG. 28 is a perspective view of a battery module 3 according to a third embodiment.

FIG. 28 is a perspective view of the battery module 3 according to a third embodiment.

End plates 15 and 15 are disposed on both end sides in the juxtaposition direction of the cells 2 of the battery module 3 according to the third embodiment. Spacers 19 made of a synthetic resin are disposed between the cells 2 and 2 and between the cell 2 and the end plate 15. The spacer 19 may have a corrugated shape. The end plates 15 and 15 sandwich the plurality of cells 2 and the spacers 19 from the juxtaposition direction. The end plate 15 is preferably made of metal such as stainless steel from the viewpoint of strength. In the case of the low pressing type, the end plate 15 may be formed of a synthetic resin.

Coupling members 16 and 16 are metal members that couple the end plates 15 and restrain the plurality of cells 2 and the plurality of spacers 19 in a pressed state. The coupling member 16 has a rectangular frame shape elongated in the juxtaposition direction. The coupling members 16 restrain the plurality of cells 2 in a pressed state by fastening both sides in the juxtaposition direction to the end plates 15 by bolts 17 in a state where the plurality of cells 2 and the spacers 19 are pressed in the juxtaposition direction by the end plates 15 and 15.

When the internal pressure of the cell 2 increases due to deterioration, the spacer 19 is deformed, and the pressing force between the end plates 15 and 15 increases.

In the third embodiment, the storage unit 42 of the BMU 4 stores a first pressing force coefficient table instead of the first expansion coefficient table 45. The relationship between the total SOC and the pressing force increase amount is obtained in advance by experiment for each of the plurality of ΔSOCs and the center SOC, and the control unit 41 calculates a coefficient of an approximate curve as the first pressing force coefficient. The first pressing force coefficient table stores a plurality of ΔSOCs and a center SOC, and corresponding first pressing force coefficients. In this case, the first pressing force coefficient is determined with reference to the first pressing force coefficient table based on the ΔSOC and the center SOC determined based on the time-series data of the SOC, and then the first pressing force coefficient (T) subjected to temperature correction by the Arrhenius plot is obtained. The first pressing force coefficient table may store the first pressing force coefficient in association with the plurality of ΔSOCs and the center SOC, and the temperature. In addition, the relationship between the time and the pressing force increase amount may be obtained in advance by experiment for each of the plurality of ΔSOCs and the center SOC, and a coefficient of an approximate curve of the relationship may be obtained as the first pressing force coefficient and stored in the first pressing force coefficient table.

The first pressing force coefficient can be interpolated by interpolation calculation.

The relationship between time and the pressing force increase amount is obtained in advance by experiment for each of the plurality of temperatures and SOCs at the time of standing, and the control unit 41 calculates a coefficient of an approximate curve of the relationship as a second pressing force coefficient. A second pressing force coefficient table stores a plurality of temperatures, SOCs at the time of standing, and corresponding second pressing force coefficients.

Figure 29:
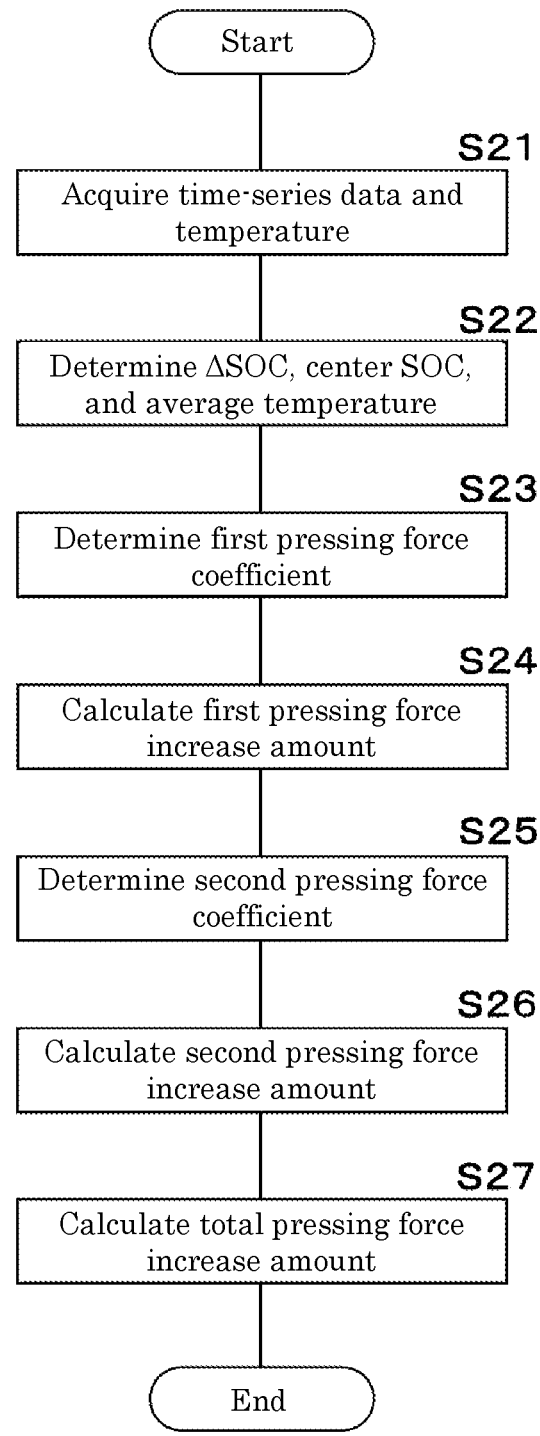
FIG. 29 is a flowchart showing a procedure of calculation processing of a pressing force increase amount by the control unit.

FIG. 29 is a flowchart showing a procedure of calculation processing of the pressing force increase amount by the control unit 41.

The control unit 41 acquires the fluctuation data of the SOC in the predetermined period and the temperature of the battery module 3 (S21).

The control unit 41 determines the ΔSOC, the center SOC as the representative SOC of the SOC, and the average temperature as the temperature representative value (S22).

The control unit 41 reads the first pressing force coefficient table corresponding to the average temperature, and determines the first pressing force coefficient based on the determined ΔSOC, center SOC, and average temperature (S23). The control unit 41 may obtain the first pressing force coefficient (T) corrected to the temperature at the time of calculation by the Arrhenius plot with respect to the determined first pressing force coefficient.

The control unit 41 calculates the first pressing force increase amount based on the determined first pressing force coefficient and the total SOC fluctuation amount (S24). The first pressing force increase amount is represented by a function of the total SOC with the first pressing force coefficient as a factor. When the coefficient of the approximate curve of the relationship between time and the pressing force obtained for each of the plurality of ΔSOCs and the center SOC is obtained as the first pressing force coefficient and stored in the first pressing force coefficient table, the first pressing force increase amount is represented by a function of time with the first pressing force coefficient as a factor.

The control unit 41 reads the second pressing force coefficient table and determines the second pressing force coefficient based on the average temperature and the SOC at the time of standing (S25).

The control unit 41 calculates the second pressing force increase amount based on the determined second pressing force coefficient and time (S26).

The control unit 41 adds the second pressing force increase amount to the first pressing force increase amount to calculate a total pressing force increase amount (S27), and ends the processing.

According to the present embodiment, the shape change of the battery module 3 can be estimated by the change in pressing force. By estimating the pressing force of the end plate 15 of the battery module 3, the battery module 3 can be favorably designed.

Fourth Embodiment

Figure 30:
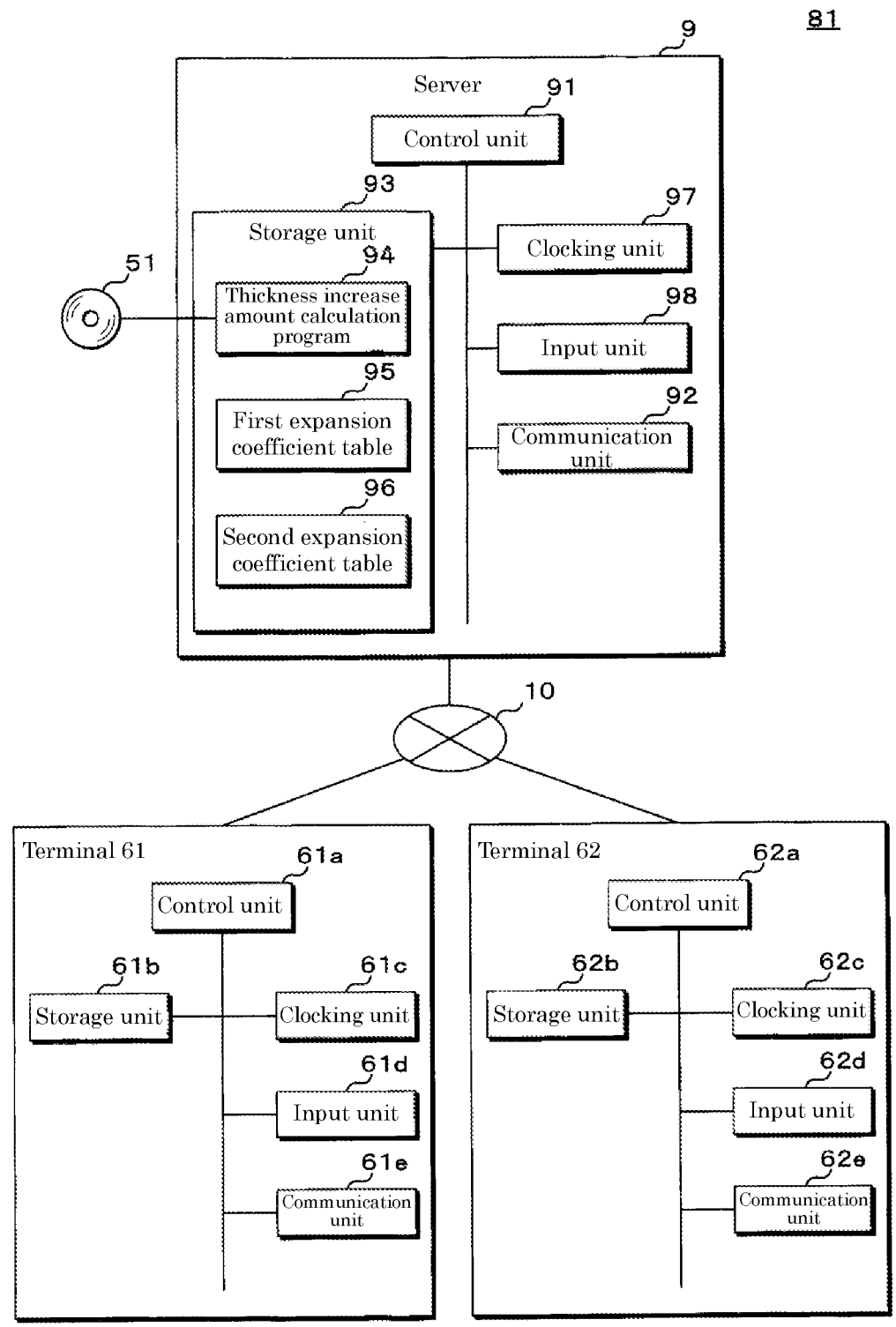
FIG. 30 is a block diagram showing an example of a configuration of an information processing system according to a fourth embodiment.

FIG. 30 is a block diagram showing an example of a configuration of an information processing system 81 according to a fourth embodiment. In the information processing system 81, terminals 61 and 62 of a user such as a designer of the server 9, the cell 2, the battery module 3, and the like of an information management company and a designer of a device on which the battery module 3 is mounted such as a vehicle are connected via the network 10 such as the Internet. The number of terminals is not limited to two. The terminals 61 and 62 can be configured by, for example, a desktop computer, a notebook personal computer, a tablet, a smartphone, or the like.

The server 9 includes a control unit 91, a storage unit 93, a clocking unit 97, an input unit 98, and a communication unit 92. These units are communicably connected to each other via a bus.

The control unit 91 functions as a processing unit that executes processing of calculating the thickness increase amount by reading and executing a thickness increase amount calculation program 94.

The clocking unit 97 performs clocking.

The input unit 98 receives input of load pattern information from the terminals 61 and 62.

The communication unit 92 has a function of communicating with the terminals 61 and 62 via the network 10, and can transmit and receive necessary information.

The storage unit 93, a first expansion coefficient table 95, and a second expansion coefficient table 96 have the same configurations as those of the storage unit 42, the first expansion coefficient table 45, and the second expansion coefficient table 46. The thickness increase amount calculation program 94 is provided in a state of being stored in a computer-readable recording medium 51 such as a CD-ROM, a DVD-ROM, or a USB memory, for example, and is stored in the storage unit 93 by being installed in the server 9. In addition, the thickness increase amount calculation program 94 may be acquired from an external computer (not shown) connected to a communication network and stored in the storage unit 93.

Similarly, the terminals 61 and 62 include control units 61a and 62a, storage units 61b and 62b, clocking units 61c and 62c, input units 61d and 62d, and communication units 61e and 62e.

Figure 31:
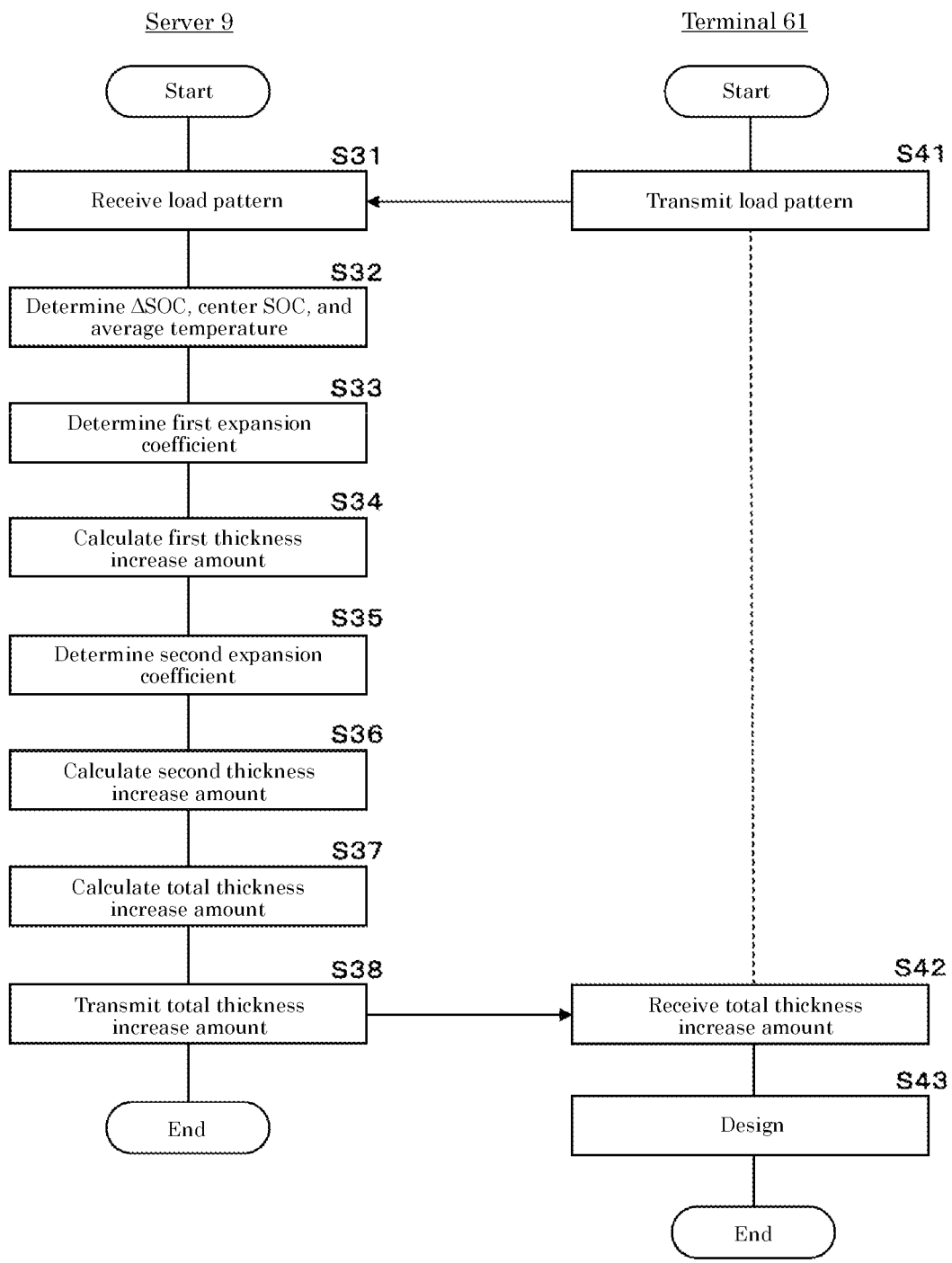
FIG. 31 is a flowchart showing a procedure of calculation processing of a thickness increase amount by a control unit and a procedure of design processing of the battery module by a control unit.

FIG. 31 is a flowchart showing a procedure of calculation processing of the thickness increase amount by the control unit 91 and a procedure of design processing of the battery module 3 by the control unit 61a.

The control unit 61a of the terminal 61 transmits the load pattern of the battery module 3 to the server 9 (S41). Examples of the load pattern include a temperature, a time, a voltage, and a current in a case where a method of using the battery module 3 is estimated.

The control unit 91 of the server 9 receives the load pattern of the battery module 3 from the terminal 61 (S31).

The control unit 91 determines the ΔSOC, the center SOC as the representative SOC of the SOC, and the average temperature as the temperature representative value based on the load pattern (S32).

The control unit 91 reads the first expansion coefficient table 95 corresponding to the average temperature, and determines the first expansion coefficient based on the determined ΔSOC and center SOC (S33). The control unit 91 may obtain the first pressing force coefficient (T) corrected to an assumed temperature by the Arrhenius plot with respect to the determined first pressing force coefficient. When the first expansion coefficient table 95 stores the first expansion coefficient corresponding to the assumed temperature, temperature correction is unnecessary.

The control unit 91 calculates the first thickness increase amount based on the determined first expansion coefficient and the total SOC (S34).

The control unit 91 reads the second expansion coefficient table 96 and determines the second expansion coefficient based on the assumed temperature and the SOC at the time of standing (S35).

The control unit 91 calculates the second thickness increase amount based on the determined second expansion coefficient and time (S36).

The control unit 91 calculates the total thickness increase amount by adding the second thickness increase amount to the first thickness increase amount (S37).

The control unit 91 transmits the data of the total thickness increase amount to the terminal 61 (S38).

The control unit 61a receives data of the total thickness increase amount from the server 9 (S42).

The control unit 61a designs the battery module 3 (S43), and ends the processing. The control unit 61a can favorably design the shape and arrangement interval of the spacers 19 arranged between the plurality of cells 2, the pressing forces of the end plates 15 sandwiching the plurality of cells 2, and the like. Therefore, the performance of the cell 2 can be maximized, the excessive increase in size of the battery module 3 can be avoided, and the cost can be reduced.

When the terminal 61 is a terminal of a designer of a device such as a vehicle on which the battery module 3 is mounted, the control unit 61a can acquire data of the total thickness increase amount and design a storage space or the like of the battery module 3 in the device. A device can also be designed based on the performance and life of the battery module 3.

The same processing as described above is performed also in the terminal 62.

Fifth Embodiment

Figure 32:
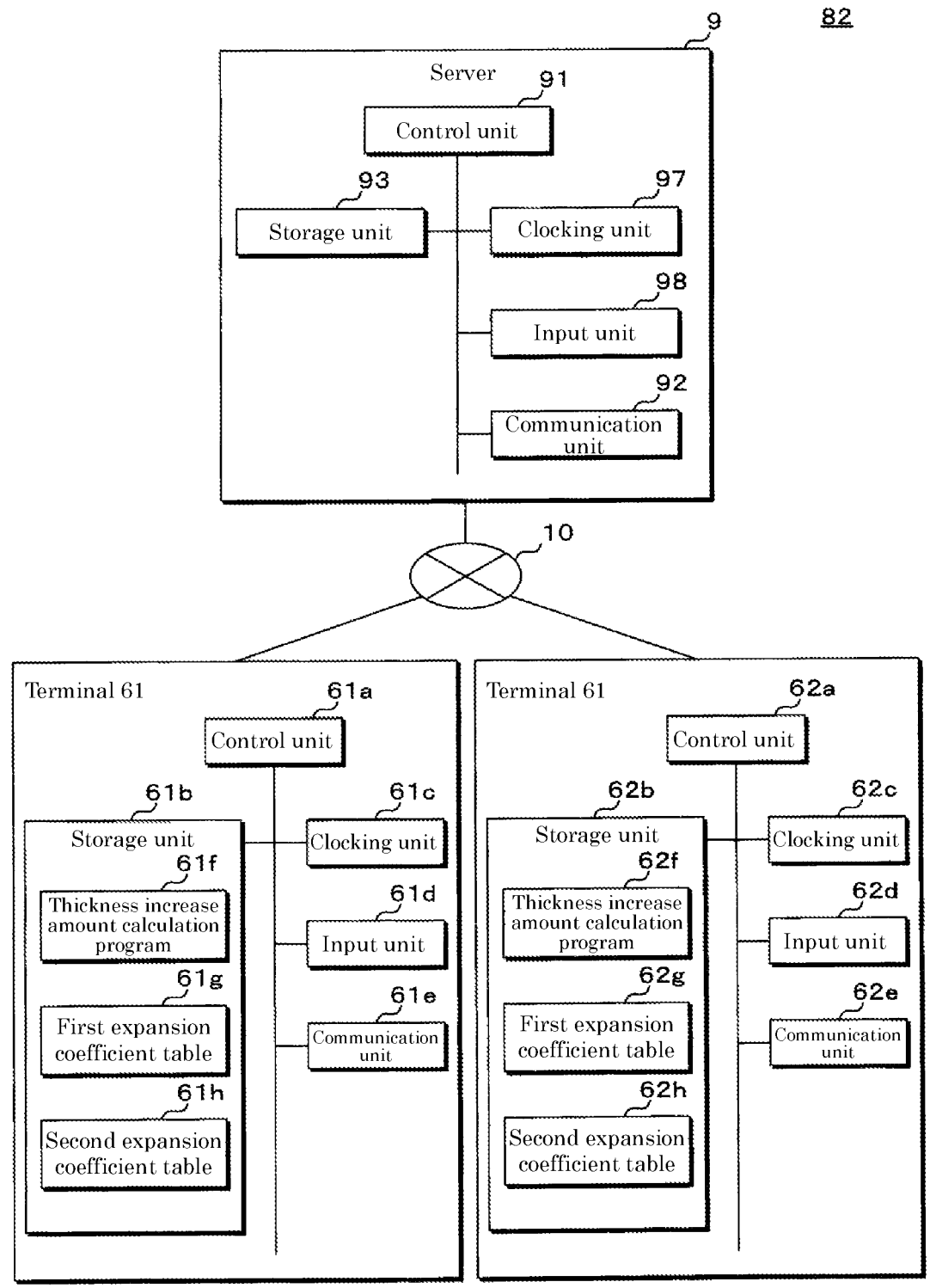
FIG. 32 is a block diagram showing an example of a configuration of an information processing system according to a fifth embodiment.

FIG. 32 is a block diagram showing an example of a configuration of an information processing system 82 according to a fifth embodiment. In the drawing, the same portions as those in FIG. 30 are denoted by the same reference numerals, and detailed description thereof is omitted.

In the information processing system 82 of the fifth embodiment, thickness increase amount calculation programs 61f and 62f, first expansion coefficient tables 61g and 62g, and second expansion coefficient tables 61h and 62h are installed in the storage units 61b and 62b of the terminals 61 and 62 from the server 9. The thickness increase amount calculation programs 61f and 62f and the like may be installed in the storage units 61b and 62b via a recording medium.

In the fifth embodiment, the control unit 61a or 62a estimates the thickness increase amount of the battery module 3, and designs the battery module 3 based on the estimated thickness increase amount. The thickness increase amount calculation programs 61f and 62f of the fifth embodiment are different from the thickness increase amount calculation program 94 in that the thickness increase amount calculation programs 61f and 62f include processing of acquiring a load pattern and processing of designing the battery module 3 and do not include load pattern reception processing and total thickness increase amount transmission processing.

Figure 33:
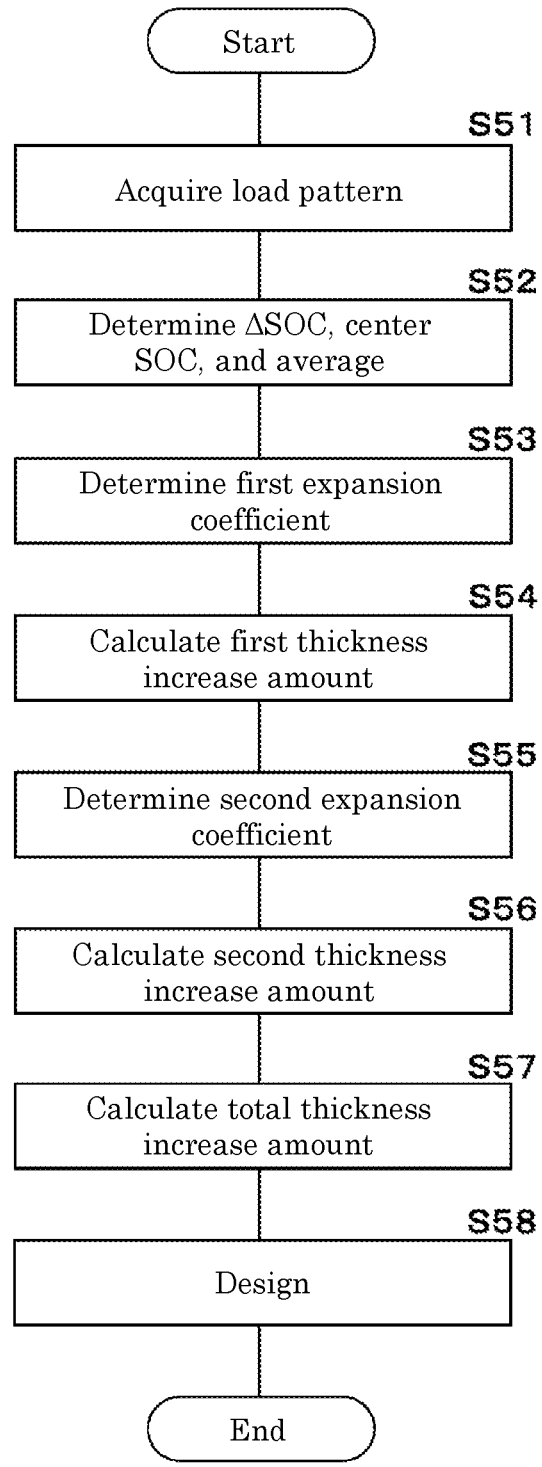
FIG. 33 is a flowchart showing a procedure of thickness increase amount calculation processing and design processing of the battery module by the control unit.

FIG. 33 is a flowchart showing a procedure of thickness increase amount calculation processing and design processing of the battery module 3 by the control unit 61a. The control unit 61a reads the thickness increase amount calculation program 61f and executes the thickness increase amount calculation processing and the design processing of the battery module 3.

The control unit 61a of the terminal 61 acquires the load pattern of the battery module 3 (S51). Examples of the load pattern include a temperature, a time, a voltage, and a current in a case where a method of using the battery module 3 is estimated.

The control unit 61a determines the ΔSOC, the center SOC as the representative SOC of the SOC, and the average temperature as the temperature representative value based on the load pattern (S52).

The control unit 61a reads the first expansion coefficient table 61g corresponding to the average temperature, and determines the first expansion coefficient based on the determined ΔSOC and center SOC (S53). The control unit 61a may obtain the first pressing force coefficient (T) corrected to the temperature at the time of calculation by the Arrhenius plot with respect to the determined first pressing force coefficient. When the first expansion coefficient table 61g stores the first expansion coefficient corresponding to the assumed temperature, temperature correction is unnecessary.

The control unit 61a calculates the first thickness increase amount based on the determined first expansion coefficient and the total SOC (S54).

The control unit 61a reads the second expansion coefficient table 61h and determines the second expansion coefficient based on the assumed temperature and the SOC at the time of standing (S55).

The control unit 61a calculates the second thickness increase amount based on the determined second expansion coefficient and time (S56).

The control unit 61a calculates the total thickness increase amount by adding the second thickness increase amount to the first thickness increase amount (S57).

The control unit 61a designs the battery module 3 (S58), and ends the processing. The control unit 61a can favorably design the shape and arrangement interval of the spacers 19 arranged between the plurality of cells 2, the pressing forces of the end plates 15 sandwiching the plurality of cells 2, and the like. Therefore, the performance of the cell 2 can be maximized, the excessive increase in size of the battery module 3 can be avoided, and the cost can be reduced.

When the terminal 61 is a terminal of a designer of a device on which the battery module 3 is mounted, the control unit 61a can design a storage space or the like of the battery module 3 in the device based on the data of the total thickness increase amount. A device can also be designed based on the performance and life of the battery module 3. Since the shape change of the battery module 3 can be accurately predicted, the model-based development can be applied to the device on which the battery module 3 is mounted.

The same processing as described above is performed also in the terminal 62.

The above embodiments are not restrictive. The scope of the present invention is intended to include all modifications within the meaning and scope equivalent to the claims.

The present invention is not limited to the case of estimating the shape change of the battery module 3, and the shape change of the cell 2 may be estimated.

The present invention is not limited to the case where the change in the pressing force is estimated as the shape change in the state where the battery module 3 is completely restrained. The cell 2 may be in a free state or in an intermediate state. A change in the force (reaction force) spreading to the outside of the cell 2 and a change in the pressure applied to at least one surface of the cell 2 may be used as the shape change.

The SOC representative value is not limited to the center SOC, and the temperature representative value is not limited to the average temperature.

The estimation method according to the present invention can also be applied to charge-discharge systems such as mobile bodies, mobile devices, power generation facilities, power demand facilities, and railway regenerative power storage devices.

The energy storage device is not limited to a lithium ion secondary battery. The energy storage device may be another secondary battery, a primary battery, or an electrochemical cell such as a capacitor.

As described above, an algorithm in which a C rate is further considered may be combined with the estimation technique described in the embodiment according to one aspect of the present invention. Estimation is performed in consideration of another dynamic parameter called a C rate, so that estimation accuracy can be improved.

Embodiment According to Another Aspect of the Present Invention

Figure 34:
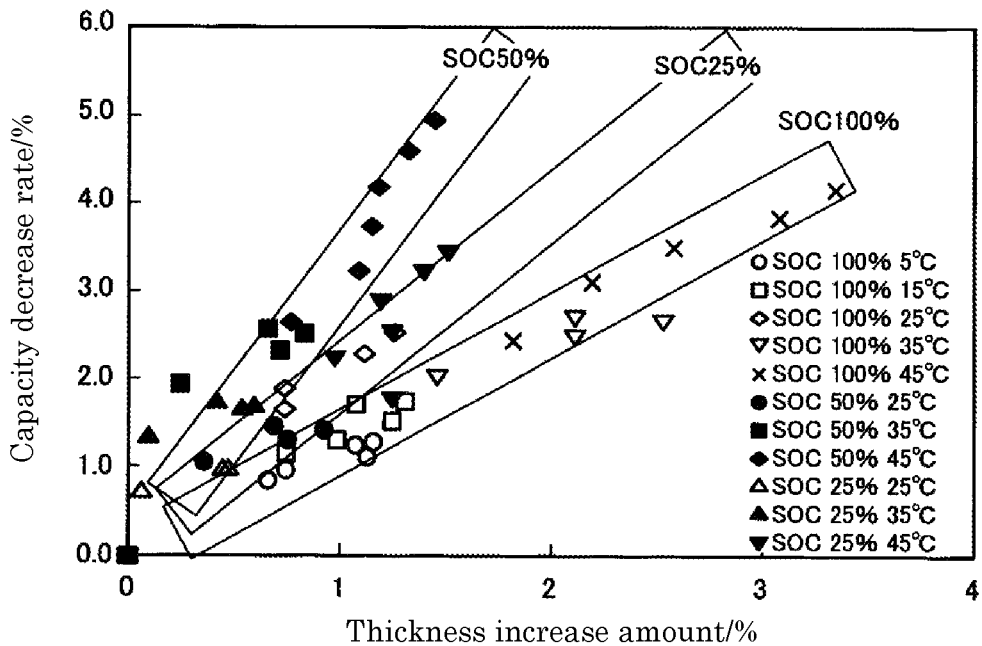
FIG. 34 is a graph showing a relationship between a thickness increase amount and a capacity decrease rate when the battery is left standing while the average SOC and the temperature of the battery are changed.

FIG. 34 is a graph showing the relationship between the thickness increase amount and the capacity decrease rate when the battery is left standing while the average SOC and the temperature of the battery (battery module) are changed. The horizontal axis represents the thickness increase amount (%), and the vertical axis represents the capacity decrease rate (%). Results obtained by actually measuring the relationship between the thickness increase amount and the capacity decrease rate when the temperature of the battery is 25° C., 35° C., and 45° C. for the cases where the average SOC is 25%, 50%, and 100%, respectively, are shown. For the case where the average SOC was 100%, the relationship between the thickness increase amount and the capacity decrease rate when the temperature was 5° C. and 15° C. was also determined.

As can be seen from FIG. 34, the slope of the approximate curve at each actual measurement point varies depending on the average SOC, and the slope of the approximate curve varies depending on the temperature even in the same average SOC.

Figure 35:
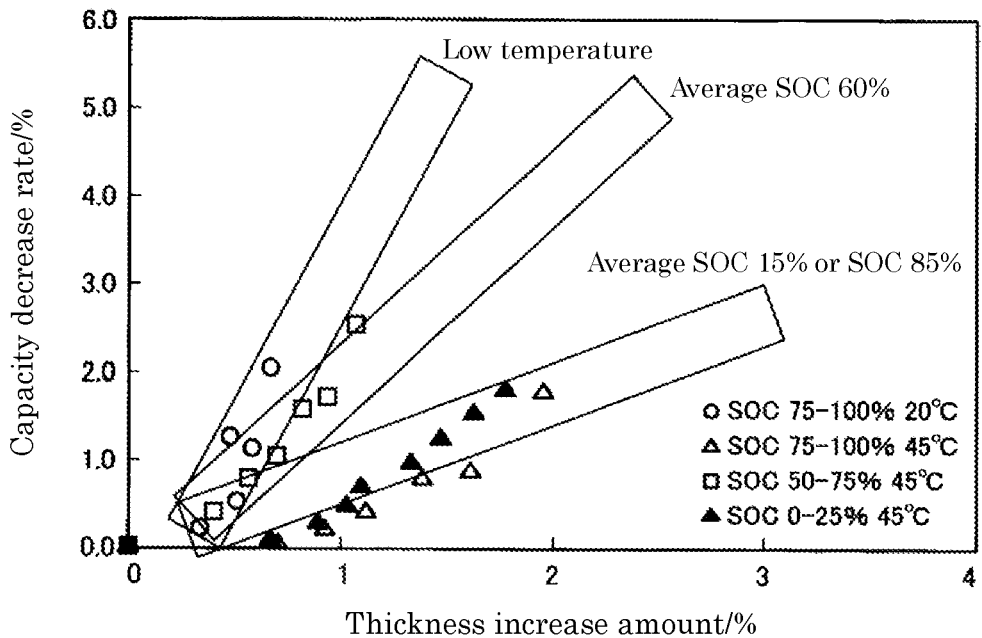
FIG. 35 is a graph showing a relationship between a thickness increase amount and a capacity decrease rate when a charge-discharge cycle test is performed while the average SOC and the temperature are changed.

FIG. 35 is a graph showing a relationship between a thickness increase amount and a capacity decrease rate when a charge-discharge cycle test is performed while changing an average SOC and a temperature. The horizontal axis represents the thickness increase amount (%), and the vertical axis represents the capacity decrease rate (%). The results of performing the cycle test in the SOC ranges of 0 to 25%, 50 to 75%, and 75 to 100% while the battery temperature is 45° C. are shown. That is, the SOC fluctuation amount per unit time is the same. The results of performing the cycle test in the SOC range of 75 to 100% at a temperature of 20° C. are also shown.

As can be seen from FIG. 35, when the SOC fluctuation amount is the same, the slope of the approximate curve varies depending on the average SOC. When the average SOC and the SOC fluctuation amount are the same, the slope of the approximate curve is larger when the environmental temperature is 20° C. than when the environmental temperature is 45° C.

Figure 36:
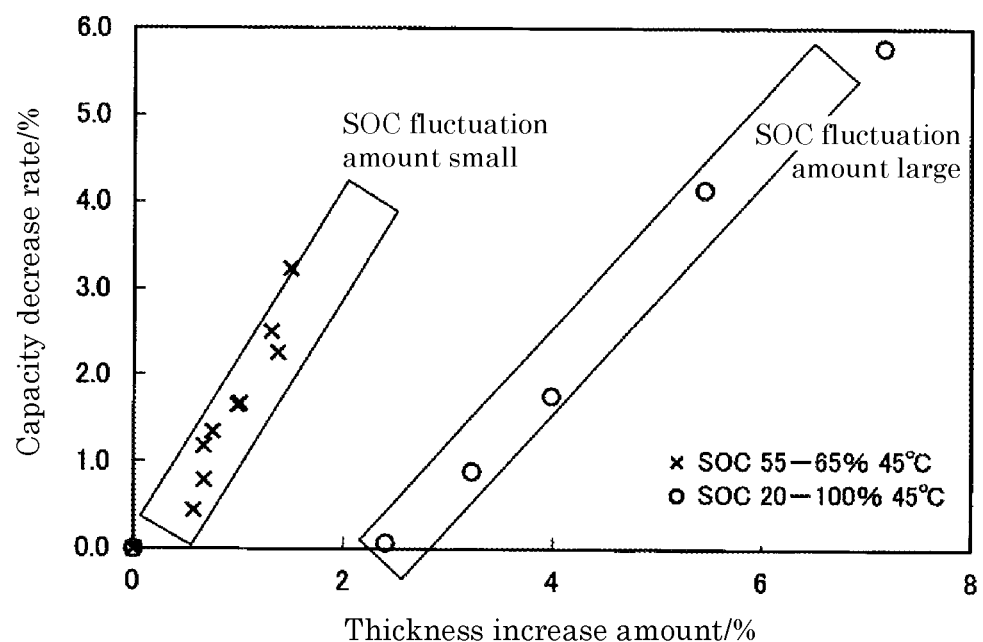
FIG. 36 is a graph showing a relationship between a thickness increase amount and a capacity decrease rate when a charge-discharge cycle test is performed while an SOC fluctuation amount per unit time is changed.

FIG. 36 is a graph showing a relationship between a thickness increase amount and a capacity decrease rate when a charge-discharge cycle test is performed while an SOC fluctuation amount is changed. The horizontal axis represents the thickness increase amount (%), and the vertical axis represents the capacity decrease rate (%). The results of performing the cycle test in the SOC ranges of 55 to 65% and 20 to 100% while the battery temperature is 45° C. are shown.

As can be seen from FIG. 36, when the average SOC is the same, the slope of the approximate curve varies depending on the SOC fluctuation amount. In the case of FIG. 3, the slope of the approximate curve is larger as the SOC fluctuation amount is smaller.

As described above, when the capacity change is plotted with respect to the thickness increase amount, the slope changes depending on the representative SOC such as the average SOC, the SOC fluctuation amount, and the temperature. The present inventors have found that the SOH can be easily and satisfactorily estimated by a function of the shape change by acquiring the representative SOC, the SOC fluctuation amount, and the temperature, determining the slope, and acquiring the shape change of the energy storage device, thereby completing the present invention.

Sixth Embodiment

Figure 37:
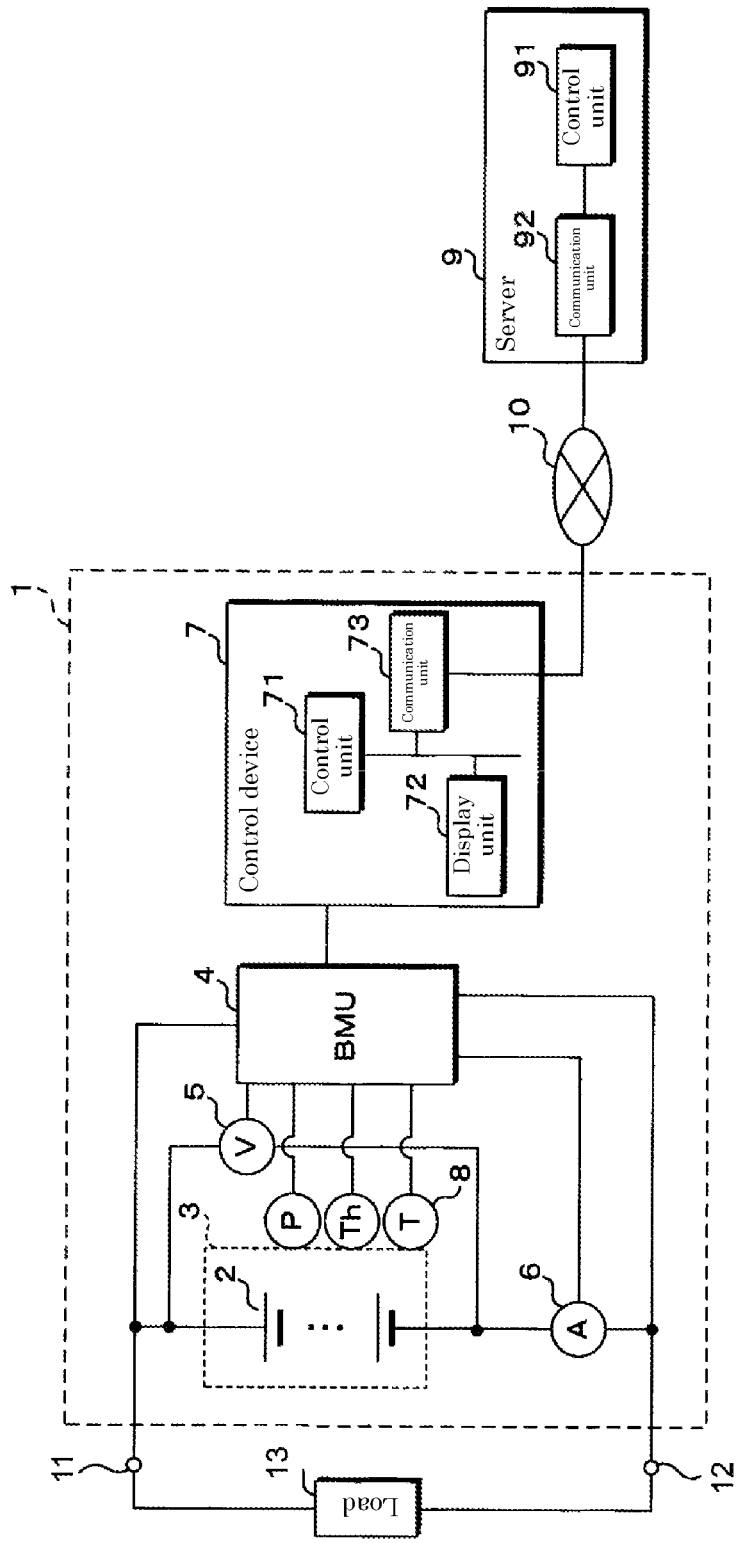
FIG. 37 is a block diagram showing the configuration of the charge-discharge system and the server according to the first embodiment.

FIG. 37 is a block diagram showing a configuration of a charge-discharge system 1 and a server 9 according to a sixth embodiment. The same devices as those in FIG. 7 are denoted by the same reference numerals in FIG. 37, and the description thereof is omitted.

The charge-discharge system 1 includes a thickness sensor Th and a pressure sensor P. The charge-discharge system 1 may include any one of the thickness sensor Th and the pressure sensor P.

In the present embodiment, any one of the BMU 4, the control device 7, and the server 9 functions as the estimation device of the present invention. When the server 9 does not function as an estimation device, the charge-discharge system 1 may not be connected to the server 9.

Although FIG. 4 shows a case where one set of battery module 3 is provided, a plurality of sets of battery modules 3 may be connected in series.

The BMU 4 may be a battery ECU.

The thickness sensor Th includes an X-ray CT device, a laser displacement sensor, a strain sensor (strain gauge), or the like. The thickness sensor Th measures the thickness of the battery module 3 in the juxtaposition direction of the cells 2.

The pressure sensor P measures a pressing force of a pair of end plates (not shown) sandwiching the battery module 3 in a state of pressing the battery module 3 in the juxtaposition direction. When the internal pressure of the cell 2 increases due to deterioration, the pressing force between the end plates increases. The pressure sensor P may measure a force (reaction force) spreading to the outside of the battery module 3 or a pressure applied to at least one surface of the battery module 3.

Figure 38:
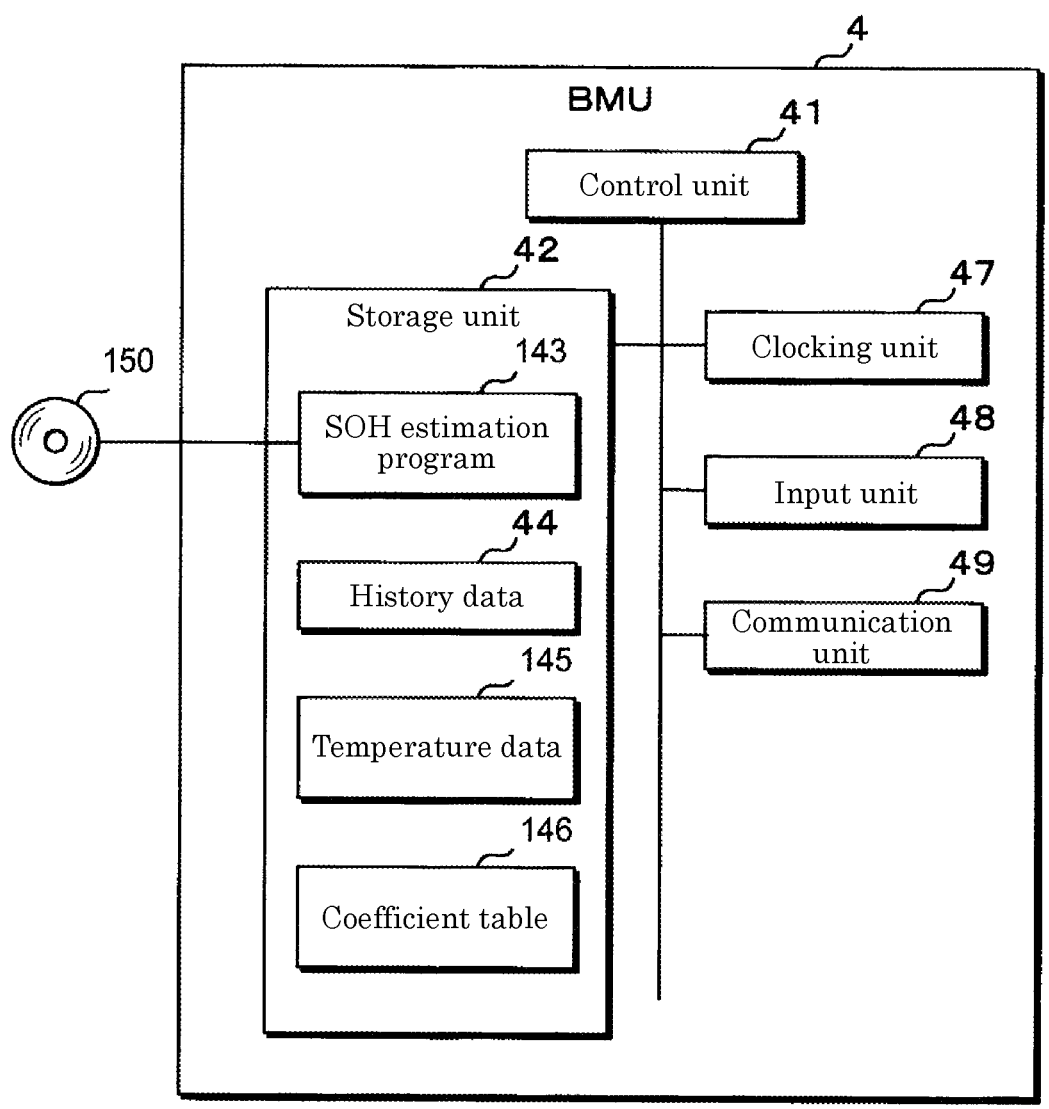
FIG. 38 is a block diagram showing a configuration of the BMU.

FIG. 38 is a block diagram showing a configuration of the BMU 4. The BMU 4 includes a control unit 41, a storage unit 42, a clocking unit 47, an input unit 48, and a communication unit 49. These units are communicably connected to each other via a bus.

The control unit 41 functions as a processing unit that executes SOH calculation processing by reading and executing an SOH estimation program 143 to be described later.

The storage unit 42 includes, for example, a hard disk drive (HDD) and stores various programs and data. The storage unit 42 stores an SOH estimation program 143. The SOH estimation program 143 is provided in a state of being stored in a computer-readable recording medium 150 such as a CD-ROM, a DVD-ROM, or a USB memory, for example, and is stored in the storage unit 42 by being installed in the BMU 4. Furthermore, the SOH estimation program 143 may be acquired from an external computer (not shown) connected to a communication network and stored in the storage unit 42.

The storage unit 42 also stores charge-discharge history data 44 and temperature data 145.

The temperature data 145 stores the transition of the temperature of the battery module 3.

The storage unit 42 also stores a coefficient table 146.

Figure 39:
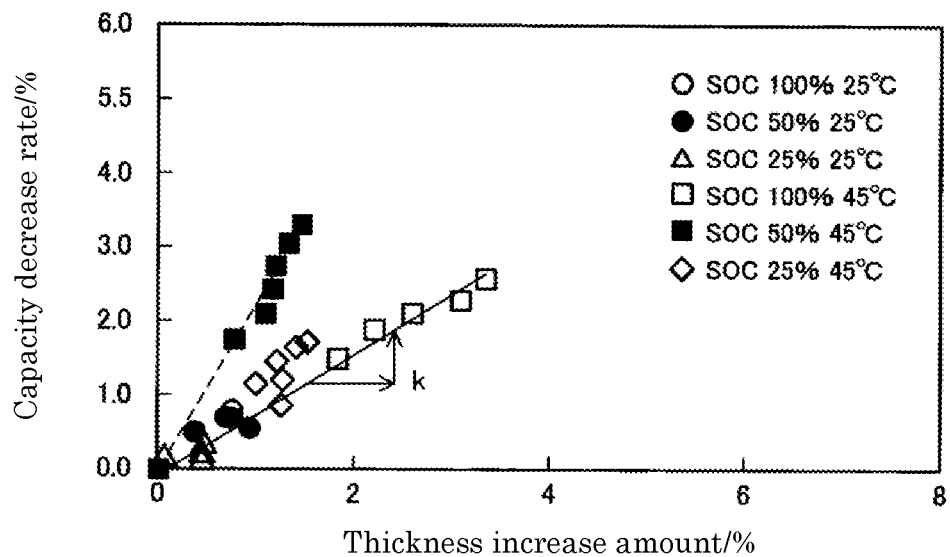
FIG. 39 is a graph showing a relationship between a thickness increase amount and a measured capacity decrease rate.

As shown in FIG. 39, a first relationship between the thickness increase amount and the SOH is obtained in advance by experiment for each of the plurality of representative SOCs and the average temperature of the battery module 3. Here, the representative SOC is an average value (average SOC) of the SOC, and the SOH is a capacity decrease rate. In FIG. 39, the horizontal axis represents the thickness increase amount (%), and the vertical axis represents the capacity decrease rate (%). The control unit 41 calculates a coefficient of an approximate curve of the first relationship as a coefficient k.

Figure 40:
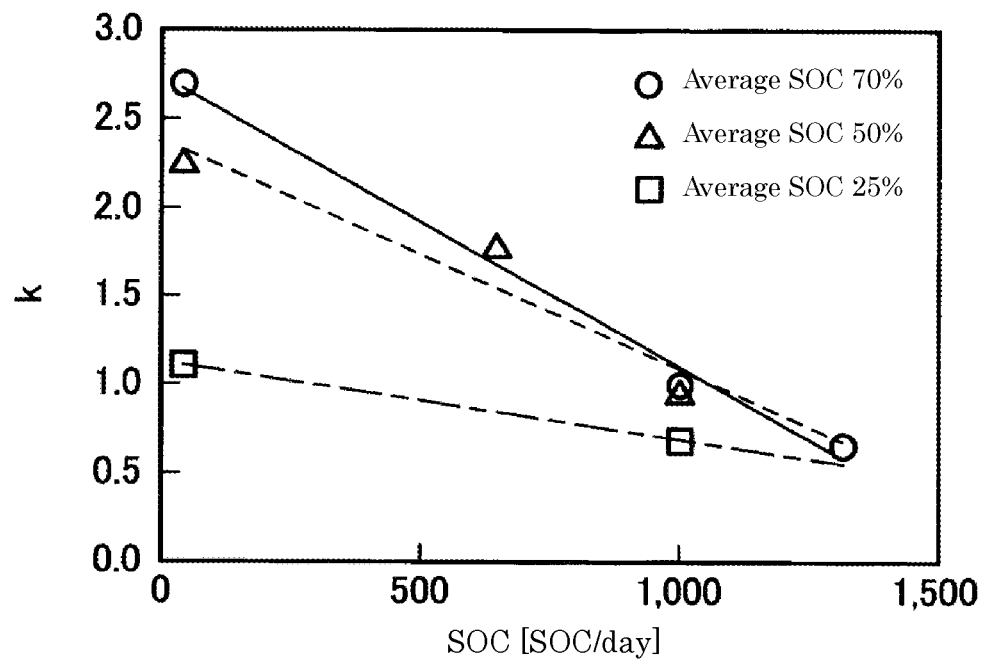
FIG. 40 is a graph showing a result of obtaining a relationship between an SOC fluctuation amount and a coefficient k for each average SOC for each temperature.

As shown in FIG. 40, a second relationship between the SOC fluctuation amount and the coefficient k is obtained by experiment for each average SOC for each temperature, and the control unit 41 stores the second relationship in the coefficient table 146. In FIG. 8, the horizontal axis represents SOC (%/day), and the vertical axis represents k. FIG. 40 shows a case where the average temperature is 45° C. The control unit 41 determines the average SOC, the SOC fluctuation amount, and the average temperature, and determines the coefficient k with reference to the second relationship stored in the coefficient table 46.

The coefficient table 146 may store the coefficient k as a function of the average SOC, the SOC fluctuation amount, and the average temperature.

The coefficient k can be interpolated by interpolation calculation.

When the representative SOC is the center value of the SOC or the mode of the SOC, the control unit 41 stores the second relationship between the SOC fluctuation amount and the coefficient k in the coefficient table 146 for each temperature and for each center value or mode of the SOC.

Instead of storing the coefficient k in the coefficient table 46 for each temperature, the temperature may be fixed to a predetermined temperature to obtain the coefficient k, the coefficient k may be stored in the coefficient table 146, the coefficient k may be determined based on the average SOC and the SOC fluctuation amount, and then the coefficient k (T) subjected to temperature correction by the Arrhenius plot may be obtained.

When the thickness sensor Th detects the pressing force of the battery module 3 (internal pressure of the battery module 3), the control unit 41 converts the pressing force increase amount into the thickness increase amount, and determines the coefficient k based on the second relationship stored in the coefficient table 146.

Alternatively, a third relationship between the pressing force increase amount and the capacity decrease rate is obtained by experiment for each of the plurality of average SOCs and temperatures. The control unit 41 calculates a coefficient of an approximate curve of the third relationship as a coefficient k. A fourth relationship between the SOC fluctuation amount and the coefficient k is obtained by experiment for each average SOC for each temperature, and the control unit 41 stores the fourth relationship in the coefficient table 146.

Instead of storing the coefficient k in the coefficient table 146 for each temperature, the temperature may be fixed to a predetermined temperature to obtain the coefficient k, the coefficient k may be stored in the coefficient table 146, the coefficient k may be determined based on the average SOC and the SOC fluctuation amount, and then the coefficient k (T) subjected to temperature correction by the Arrhenius plot may be obtained.

Figure 41:
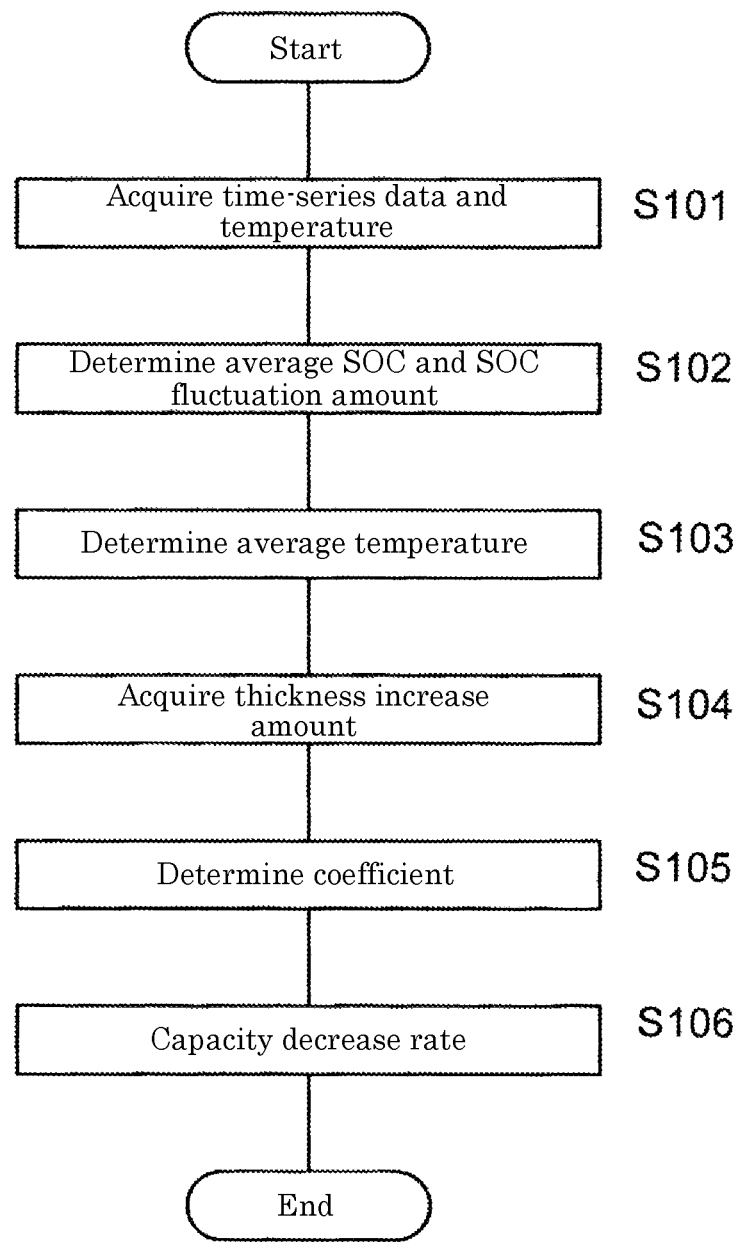
FIG. 41 is a flowchart showing a procedure of calculation processing of the capacity decrease rate by the control unit.

FIG. 41 is a flowchart showing a procedure of calculation processing of the capacity decrease rate by the control unit 41.

Figure 42:
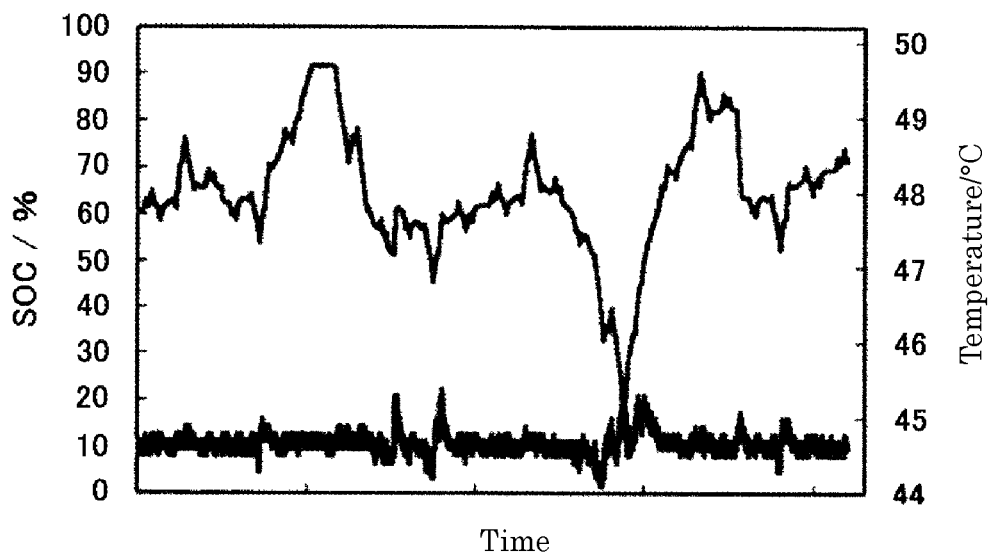
FIG. 42 is a graph showing a relationship between time and SOC in a predetermined period and a relationship between time and temperature.

The control unit 41 acquires the time-series data of the SOC and the temperature (S101). As shown in FIG. 42, the control unit 41 acquires the relationship between the time and the SOC in the predetermined period and the relationship between the time and the temperature. In FIG. 42, the horizontal axis represents time, the left vertical axis represents SOC (%), and the right vertical axis represents temperature (° C.).

The control unit 41 determines the average SOC (%) as the representative SOC and the SOC fluctuation amount (%/day) (S102). The control unit 41 may calculate the standard deviation and the average value of the SOC based on the time-series data and determine the calculated average value as the representative SOC. The average value is substantially equal to the center value of the SOC.

The control unit 41 may acquire the charge start point and the discharge start point from the time-series data and determine an intermediate SOC between the charge start point and the discharge start point as the center value of the SOC.

Figure 43:
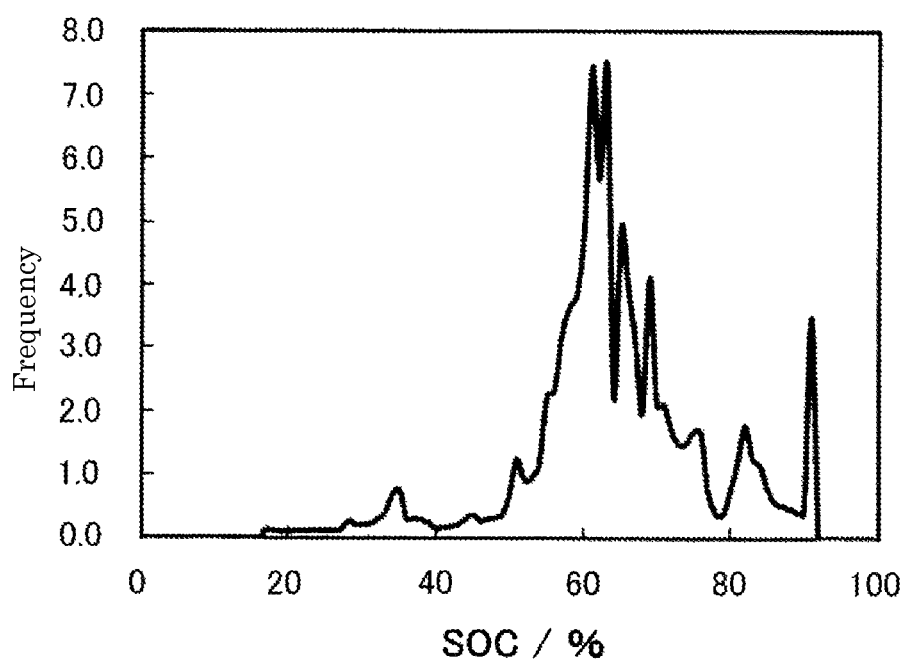
FIG. 43 is a frequency map of SOC.

The control unit 41 may generate the frequency map of the SOC shown in FIG. 43 and determine the mode of the SOC as the representative SOC. In FIG. 43, the horizontal axis represents SOC (%), and the vertical axis represents frequency.

The control unit 41 determines the average temperature based on the time-series data (S103).

The control unit 41 acquires the thickness increase amount based on the thickness detected by the thickness sensor 11 (S104).

The control unit 41 reads the coefficient table 146 and determines the coefficient k based on the determined representative SOC and SOC fluctuation amount (S105). When the control unit 41 determines that the average temperature is 45° C., the average SOC is 25%, and the SOC fluctuation amount is 500 (%/day), for example, in the graph in which the average SOC is 25% in FIG. 8, the coefficient k when the SOC fluctuation amount is 500 (%/day) is read.

The control unit 41 calculates the capacity decrease rate (S106) and ends the processing. As shown in FIG. 39, the capacity decrease rate is represented by a function of the thickness increase amount with the coefficient k as a factor. The control unit 41 substitutes the thickness increase amount acquired at the estimation time point into a variable of the function to calculate the capacity decrease rate.

When the pressing force of the battery module 3 is detected by the pressure sensor, the capacity decrease rate is calculated similarly to that described above.

Figure 44:
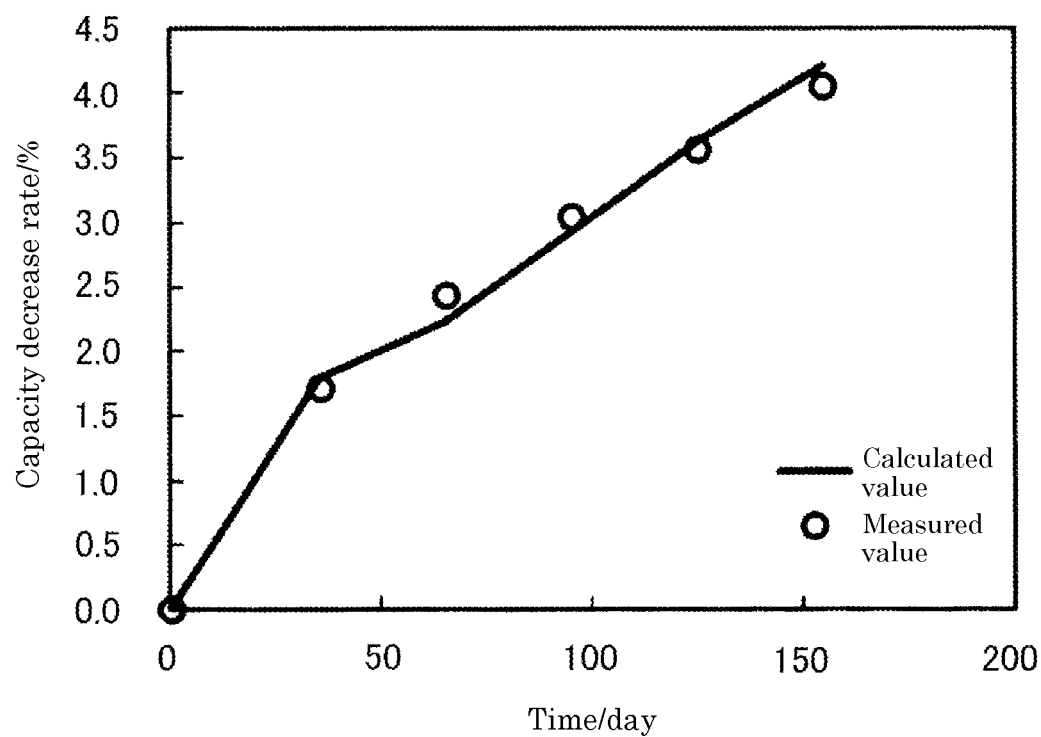
FIG. 44 is a graph showing a relationship between an elapsed time and a capacity decrease rate.

FIG. 44 is a graph showing an estimated time point at which the thickness increase amount is acquired as an elapsed time, and showing a relationship between the elapsed time and a capacity decrease rate calculated based on the thickness increase amount acquired in correspondence with the elapsed time. The horizontal axis represents time (day), and the vertical axis represents the capacity decrease rate (%). FIG. 44 also shows measured values of the capacity decrease rates at a plurality of elapsed times.

It can be seen from FIG. 44 that the accuracy of the estimation of the capacity decrease rate by the estimation method of the present embodiment is good.

In the present embodiment, the representative SOC and the SOC fluctuation amount, which are feature values of the time-series data of the SOC, and the average temperature are determined, and the deterioration of the battery module 3 is estimated based on the determined representative SOC, SOC fluctuation amount, and average temperature, and the acquired thickness increase amount of the battery module 3. It is possible to easily and accurately estimate the deterioration at an arbitrary time point during the use of the battery module 3 including the case where the fluctuation pattern of the SOC is complicated.

Based on the estimated SOH, a future use method of the battery module 3 can be determined.

The information necessary for the estimation is the feature value and the shape change of the battery module 3, and it is not necessary to use a large measuring device such as a charge-discharge device, and the labor and cost can be suppressed.

Since deterioration can be estimated only by a shape change of the battery module 3, deterioration of the battery module 3 can be constantly monitored only by installing a sensor that detects a thickness, an internal pressure, or the like. The calculation of the estimation can be simplified, and the BMU 4 can be simplified.

The above embodiments are not restrictive. The scope of the present invention is intended to include all modifications within the meaning and scope equivalent to the claims.

The present invention is not limited to the case where the capacity decrease rate is estimated based on the shape change of the battery module 3, and the capacity decrease rate may be estimated based on the shape change of the cell 2.

The present invention is not limited to the case where the change in the pressing force is estimated as the shape change in the state where the battery module 3 is completely restrained. The cell 2 may be in a free state or in an intermediate state. A change in the force (reaction force) spreading to the outside of the cell 2 and a change in the pressure applied to at least one surface of the cell 2 may be used as the shape change.

The SOC representative value is not limited to the center SOC, and the temperature representative value is not limited to the average temperature.

The present invention is not limited to the case of estimating the capacity decrease rate as the SOH, and the capacity retention ratio, the resistance value, and the like may be estimated. In this case, the relationship between the thickness increase amount and the capacity retention ratio or the resistance value is obtained by experiment, and the coefficient of the approximate curve of the relationship is calculated as the coefficient k.

The estimation method according to the present invention can also be applied to charge-discharge systems such as mobile bodies, mobile devices, power generation facilities, power demand facilities, and railway regenerative power storage devices.

The energy storage device is not limited to a lithium ion secondary battery. The energy storage device may be another secondary battery, a primary battery, or an electrochemical cell such as a capacitor.

As described above, an algorithm in which a C rate is further considered may be combined with the estimation technique described in the embodiment according to one aspect of the present invention. Estimation is performed in consideration of another dynamic parameter called a C rate, so that estimation accuracy can be improved.

The invention claimed is:

1. An estimation device comprising:
an acquisition unit that acquires time-series data of an SOC in an energy storage device;
a determination unit that determines a fluctuation range of the SOC in the time-series data and an SOC representative value representing an SOC region in the fluctuation range; and
an estimation unit that estimates a shape change of the energy storage device based on the determined fluctuation range and the determined SOC representative value.

2. The estimation device according to claim 1, wherein:
the determination unit acquires a charge start point and a discharge start point based on the time-series data, and
the determination unit determines the fluctuation range and the SOC representative value based on the acquired charge start point and the acquired discharge start point.

3. The estimation device according to claim 1, wherein:
the determination unit calculates, based on the time-series data, the fluctuation range and the SOC representative value each time the SOC reaches a threshold from a start point, and
the determination unit determines the fluctuation range and the SOC representative value calculated from the start point to a calculation time point.

4. The estimation device according to claim 1, wherein:
the determination unit calculates a standard deviation and an average value of the SOC based on the time-series data, and
the determination unit determines the calculated standard deviation and average value as the fluctuation range and the SOC representative value.

5. The estimation device according to claim 1, wherein:
the determination unit converts a waveform of fluctuation of the SOC in the time-series data into a frequency component, and
the determination unit determines an amplitude of the converted frequency component as the fluctuation range, and a frequency as a fluctuation amount of the SOC.

6. The estimation device according to claim 1, wherein:
the estimation unit determines an expansion coefficient based on the determined fluctuation range and the determined SOC representative value with reference to a relationship between the fluctuation range, the SOC representative value, and the expansion coefficient, and
the estimation unit estimates the shape change based on the determined expansion coefficient and a fluctuation amount of the SOC or time.

7. The estimation device according to claim 1, wherein:
the estimation unit calculates the shape change of the energy storage device at the time of energization based on the fluctuation range and the SOC representative value, and
the estimation unit estimates the shape change by adding a temporal shape change of the energy storage device to the calculated shape change.

8. The estimation device according to claim 1, further comprising a prediction unit that predicts a remaining life of the energy storage device based on the shape change estimated by the estimation unit.

9. The estimation device according to claim 1, wherein the shape change includes information on pressure applied to at least one surface of the energy storage device.

10. The estimation device according to claim 1, wherein:
the acquisition unit acquires a temperature of the energy storage device in a section corresponding to the SOC region,
the determination unit determines a temperature representative value representing the temperature of the section, and
the estimation unit estimates the shape change based on the temperature representative value.

11. An estimation method comprising:
acquiring time-series data of an SOC in an energy storage device;
determining a fluctuation range of the SOC in the time-series data and a representative value of the SOC representing an SOC region in the fluctuation range; and
estimating a shape change of the energy storage device based on the determined fluctuation range and the determined representative value.

12. A computer program product comprising at least one non-transitory computer-readable storage medium having computer-readable program code portions stored therein and configured for:
estimating time-series data of an SOC in an energy storage device;
determining a fluctuation range of the SOC in the estimated time-series data and a representative value of the SOC representing an SOC region in the fluctuation range; and
estimating a shape change of the energy storage device based on the determined fluctuation range and the determined representative value.

13. An estimation device comprising:
a first acquisition unit that acquires time-series data of an SOC in an energy storage device;
a second acquisition unit that acquires a shape change of the energy storage device;
a determination unit that determines a representative value of the SOC in a predetermined period of the time-series data and an SOC fluctuation amount; and
an estimation unit that estimates deterioration of the energy storage device based on the determined representative value, the determined SOC fluctuation amount, and the acquired shape change.

14. The estimation device according to claim 13, wherein:
the estimation unit determines a coefficient based on the determined representative value and the determined SOC fluctuation amount with reference to a relationship between the representative value, the SOC fluctuation amount, and the coefficient, and
the estimation unit estimates the deterioration based on the determined coefficient and the acquired shape change.

15. The estimation device according to claim 14, further comprising a third acquisition unit that acquires a temperature of the energy storage device in a period in which the time-series data is acquired,
wherein the determination unit determines a temperature representative value based on the acquired temperature, and wherein the estimation unit estimates the deterioration based on the determined temperature representative value.

16. The estimation device according to claim 13, further comprising a third acquisition unit that acquires a temperature of the energy storage device in a period in which the time-series data is acquired,
  wherein the determination unit determines a temperature representative value based on the acquired temperature, and
  wherein the estimation unit estimates the deterioration based on the determined temperature representative value.

* * * * *